US011835577B2

(12) United States Patent (10) Patent No.: US 11,835,577 B2
Heldeis (45) Date of Patent: Dec. 5, 2023

(54) METHOD FOR ALLOCATING ADDRESSES AND CORRESPONDING UNITS

(71) Applicant: Christoph Heldeis, Munich (DE)

(72) Inventor: Christoph Heldeis, Munich (DE)

(73) Assignee: Christoph Heldeis, Munich (DE)

( * ) Notice: Subject to any disclaimer, the term of this patent is extended or adjusted under 35 U.S.C. 154(b) by 133 days.

(21) Appl. No.: 17/422,701

(22) PCT Filed: Jan. 15, 2019

(86) PCT No.: PCT/EP2019/050939
§ 371 (c)(1),
(2) Date: Jul. 13, 2021

(87) PCT Pub. No.: WO2020/147932
PCT Pub. Date: Jul. 23, 2020

(65) Prior Publication Data
US 2022/0065928 A1   Mar. 3, 2022

(51) Int. Cl.
*G01R 31/317* (2006.01)
*G01R 31/3185* (2006.01)
*G06F 13/37* (2006.01)

(52) U.S. Cl.
CPC .   *G01R 31/31722* (2013.01); *G01R 31/31853* (2013.01); *G01R 31/318536* (2013.01); *G06F 13/37* (2013.01)

(58) Field of Classification Search
CPC ........ G01R 31/31722; G01R 31/31853; G01R 31/318536; G06F 13/37

(Continued)

(56) References Cited

U.S. PATENT DOCUMENTS 4,285,037 A * 8/1981 Von Stetten ............ H04L 12/50
710/316
5,142,689 A * 8/1992 Eisenack ................ G06F 13/362
710/107

(Continued)

FOREIGN PATENT DOCUMENTS

DE   10 2008 037 093 A1   2/2010
DE   10 2008 037093 A1    2/2010

(Continued)

OTHER PUBLICATIONS

International Search Report (three pages) dated Jul. 25, 2019 from corresponding PCT Application No. PCT/EP2019/050939.

(Continued)

*Primary Examiner* — John J Tabone, Jr.
(74) *Attorney, Agent, or Firm* — Crowell & Moring, LLP

(57) ABSTRACT

A method includes providing a first and second electronic unit unit, generating a wirelessly transmitted signal for detecting or generating one signal or several signals for detection on a chain of electronic elements, for the first unit, detecting a transmission time of the wirelessly transmitted signal for detection or detecting a first transmission time on a first of the chain, for the second unit, detecting a second value or the transmission time of the wirelessly transmitted signal for detection or detecting a second value or a second transmission time on a second position of the chain that is different from the first position, converting the first value or the transmission time detected for the first unit to a first address for the first unit, and converting the second value or the transmission time detected within or for the second unit to a second address for the second unit.

12 Claims, 14 Drawing Sheets

(58) Field of Classification Search
USPC .......................................................... 714/724
See application file for complete search history.

(56) References Cited

U.S. PATENT DOCUMENTS

| | | | | |
|---|---|---|---|---|
| 6,700,877 | B1* | 3/2004 | Lorenz | H04L 61/5038 370/254 |
| 7,328,286 | B2* | 2/2008 | Vinnemann | H04L 12/403 710/9 |
| 2005/0114577 | A1* | 5/2005 | Beckhoff | G05B 19/042 710/110 |
| 2006/0282549 | A1* | 12/2006 | Vinnemann | H04L 61/00 710/3 |
| 2011/0006922 | A1* | 1/2011 | Tsuboi | G08G 1/123 725/75 |
| 2013/0173960 | A1 | 7/2013 | Barthel et al. | |
| 2013/0326099 | A1* | 12/2013 | Schmidt | H04L 61/5038 710/110 |
| 2015/0222594 | A1* | 8/2015 | Fritsch | H04L 61/5046 370/254 |
| 2019/0384735 | A1* | 12/2019 | Schmitz | H04L 12/403 |
| 2022/0065928 | A1* | 3/2022 | Heldeis | G01R 31/318536 |

FOREIGN PATENT DOCUMENTS

| | | |
|---|---|---|
| EP | 1 284 556 A1 | 2/2003 |
| EP | 1 455 278 A1 | 9/2004 |
| WO | 2013/002763 A1 | 1/2013 |
| WO | WO2013/002763 A1 | 1/2013 |

OTHER PUBLICATIONS

Written Opinion (ten pages) dated Jul. 25, 2019 from corresponding PCT Application No. PCT/EP2019/050939.
U.S. Appl. No. 17/422,666, filed Jul. 13, 2021.
U.S. Appl. No. 17/422,681, filed Jul. 13, 2021.
U.S. Appl. No. 17/422,804, filed Jul. 14, 2021.
European Office Action dated Feb. 3, 2023 in corresponding European Patent Application No. 19 700 902.0.

* cited by examiner

Fig. 7

METHOD FOR ALLOCATING ADDRESSES AND CORRESPONDING UNITS

This application is a national application based on Patent Cooperation Treaty Patent Application No. PCT/EP2019/050939, filed on Jan. 15, 2019, the entire contents of which are incorporated herein by reference.

FIELD OF THE INVENTION

This invention generally relates to a method for allocating addresses and corresponding units. The invention concerns more particularly allocation methods that may be used for bus systems that do not have separate address lines. Furthermore, the invention relates to a corresponding control unit and to a corresponding unit.

BACKGROUND OF THE INVENTION

It is possible to program addresses into units that are part of the same system. Programming may be done manually, for instance by using DIL (Dual In Line) switches or automatically.

SUMMARY OF THE INVENTION

Method for allocating addresses to electronic units, including:
 providing a first electronic unit and a second electronic unit,
 generating a wirelessly transmitted signal for detecting or generating one signal or several signals for detection on a chain of electronic elements,
 either performing the following method a):
 within or for the first unit, detecting a first value or the transmission time of the wirelessly transmitted signal for detection or detecting a first value or a first transmission time on a first position of the chain,
 within or for the second unit, detecting a second value or the transmission time of the wirelessly transmitted signal for detection or detecting a second value or a second transmission time on a second position of the chain that is different from the first position,
 converting the first value or the transmission time detected within or for the first unit to a first address for the first unit, and
 converting the second value or the transmission time detected within or for the second unit to a second address for the second unit,
 or performing the following method b):
 comparing a first value detected on a first position of the chain with at least one threshold value,
 comparing a second value detected on a second position of the chain with the at least one threshold value, wherein the second position of the chain is different from the first position,
 generating a preliminary address of the first unit depending on the result of the comparison based on the first value, and
 generating a preliminary address of the second unit depending on the result of the comparison based on the second value.

Furthermore, there are a corresponding control unit and a corresponding unit according to the disclosure herein.

Description of General Embodiments

It is an object of the invention to give a method for allocating addresses to electronic units. Preferably the method should be easy to implement, especially without using processors in the units that get the addresses. Further, the method should be applicable preferably for dozens of, for hundreds of or even for thousands of units. Furthermore, a corresponding control unit and a corresponding unit have to be given.

These problems are solved by the methods and units according to the embodiments disclosed herein. Embodiments are given in the sub claims.

The method for allocating addresses to electronic units comprises:
 providing a first electronic unit and a second electronic unit,
 generating a wirelessly transmitted signal for detecting or generating one signal or several signals for detection on a chain of electronic elements,
 either performing the following method a):
 within or for the first unit, detecting a first value or the transmission time of the wirelessly transmitted signal for detection or detecting a first value or a first transmission time on a first position of the chain,
 within or for the second unit, detecting a second value or the transmission time of the wirelessly transmitted signal for detection or detecting a second value or a second transmission time on a second position of the chain that is different from the first position,
 converting the first value or the transmission time detected within or for the first unit to a first address for the first unit, and
 converting the second value or the transmission time detected within or for the second unit to a second address for the second unit,
 or performing the following method b):
 comparing a first value detected on a first position of the chain with at least one threshold value,
 comparing a second value detected on a second position of the chain with the at least one threshold value, wherein the second position of the chain is different from the first position,
 generating a preliminary address of the first unit depending on the result of the comparison based on the first value, and
 generating a preliminary address of the second unit depending on the result of the comparison based on the second value.

The first address may be used for addressing the first unit. Accordingly, the second address may be used for addressing the second unit. The address may be a destination address if the unit receives data. The address may be a source address if the unit sends data. The addressing of the units may take place within a transmission method that transmits data to the units and/or that receives data from the units. The transmission method may be used for address allocation and/or for other purposes than address allocation.

The addresses that are created from the values or from the transmission time may be used directly as an address or as part of an address that is used as a final address of the unit. It is possible to create a look up table to consider gaps within the address space. Alternatively, it is possible to use the first addresses as preliminary addresses that are used as seeds in order to create final addresses. The final addresses may have an increasing or decreasing order that corresponds to the order of the units on the chain or to the distances of the units from a control unit that transmitted the signal for detection, especially by a wireless transmission. The final addresses may have no gaps, i.e. all addresses of a given range are used.

Both methods a) and b) are especially useful for bus systems, preferably for bus systems that include lines for data transmission but no separate lines for address data transmission nor multiplexed data and address lines. Method a) is especially appropriate for analog digital converters (ADC), preferably for ADCs that perform at least a 10 bit conversion. Method b) maybe implemented using ADCs or simpler Schmitt trigger (ST) circuits or other detection circuits.

Transmission time may be easier detected using a chain of electronic elements, especially a chain that allows a slower signal transmission compared with a signal transmission on a conductive wire or line or compared to the speed of light that is relevant for wireless transmission by radio. A start signal for counters in the units may be sent or transmitted via the wires/lines of bus system or wirelessly. The counting is stopped if the signal for detection is received in the respective unit. The end value of the respective counter is proportional to the transmission time or gives the transmission time. Needless to say that all counters count with the same counting speed up or down.

Detection of the transmission time is also possible for wirelessly transmitted signals. The starting signal for the counters in the units may be transmitted by radio, i.e. using electromagnetic waves or even light. The signal that is used for the detection of transmission times may be a signal that has a much slower transmission speed compared to the synchronizing or starting signal. Sonic signals or ultrasonic signals may for instance be used for this purpose.

At least 10, at least 100 or at least 1000 units may be included within the method. The units may preferably have the same structure and the same functions. All units may have the same functions with regard to address allocation, i.e. perform also the steps that are performed by the first unit and by the second unit. There may be less than 100 000 or less than 10 000 units that are involved in the address allocation. The structure may refer to the layout of layers of integrated circuits and/or to the layout of electronic circuitry. The same structure may be relevant for input arrangements, e.g. keyboards, LED (Light Emitting Diode) chains, displays etc. Alternatively, it is possible to have units with different functions, i.e. units having only actuating elements and/or units having only sensing elements and/or units having both actuating elements and sensing elements. Units with different functions may be relevant in automotive applications or in building installation applications.

The chain may comprise at least 2, at least 10, at least 100 or at least 1000 electronic elements, especially at least one of resistors, capacitors, resistors as well as capacitors and electronically active elements. The electronic components may have the same electronic values or characteristics within a given tolerance, i.e. plus or minus, referred to a nominal value of for instance 1 percent, 2 percent or 5 percent. The electronic elements or components may have increasing or decreasing electronic values along the chain.

There may be less than 100 000 or less than 10 000 electronic elements or electronic components within the chain. The chain may be a serial connection of the electronic elements, i.e. the same current flows through all elements for instance. Other connections may also be relevant. Examples for active elements are diodes, transistors, e.g. bipolar or field effect, etc. There may also be applications for other electronic elements, for instance for coils having inductance. The advantage of a chain of electronic elements is for instance its simplicity compared with transmitters and senders for wireless transmission. Wires or lines of bus may be produced at the same time and/or on the same carrier as the chain of electronic elements.

The units may be able or may be used to generate signals that are applied to the chain of electronic elements, whereby preferably preliminary addresses of the units are used to address only a part of the units. The signals may be potentials, i.e. more static signals for instance.

The preliminary addresses may be different from final addresses. The generation of signals by selective units on the chain may be used to enable and/or to ease the address allocation. Thus it is possible to implement very robust allocation methods with regard to noise, EMI (Electromagnetic Interference), tolerances of electronic components etc. This is independent of the kind of signal detection by an ADC for instance or by an ST circuit. Methods that use groups of the units are feasible, for instance by using bisectional methods.

The units or a part of the units may include an analog digital converter that converts a detected analog value to a digital value, preferably to a digital value having at least 8, 10 or 12 bits. The use of an ADC may be a good solution if the ADC is also used for other purposes than address allocation, for instance for analog input elements. An ADC having 12 bits allows for instance 4096 detection steps. Thus it may be possible to allocate different addresses to many units, see the numbers given above.

Partitions or segments may be formed within the preliminary address range during detection. For each partition only a part of the chain of electronic elements may be used for active detection and the other part or the other parts of the chain may be hold to the same electric potentials, especially to low potential, preferably to ground potential or to high potential, preferably to Vdd. This partitioning or segmentation allows higher potential steps between adjacent SLC, i.e. on the electronic elements to which the SLCs are connected with their detection circuits. Higher steps make detection of differences easier and more robust against noise, tolerances of electronic circuitry, influences of temperature, EMI etc.

Within at least one partition or in all partitions sub partitions may be formed. For each sub partition only a part of the chain may be used for active detection and the other part or the other parts of the chain may be hold to the same electric potentials, especially to low potential, preferably to ground potential or to high potential, preferably to Vdd. This allows a further refinement of the detection and the height of steps or changes in electric potential on adjacent electronic components may be made even higher. The resolution of detection is increased thereby and detection errors may be prevented or decreased.

During the allocation of final addresses at least two partitions or at least two sub partitions may be united within a preliminary address range. The detection may be made again for the units that have addresses within the united address range. The final address allocation may only be made to the units having preliminary addresses in a part of the partition or in a part of the sub partition, preferably in a part that corresponds to electronic elements of chain 4 that is nearer to the end where the allocation of final addresses is made first. This allows avoiding errors on the upper border of the united segments. The addresses of "old" units that have preliminary addresses in the upper address range are later united with addresses of units within the next partition of address space. The "old" units have then addresses in the lower part, i.e. allocation errors are again avoided for these units. This may be compared with zone melting of a solid material that results in mono crystals without errors or with only few errors.

In the allocation method that uses ADCs at least one, at least two or all of the following commands may be used during address allocation, whereby the commands preferably are defined for a wireless transmitting protocol or for a bus transmitting protocol for a bus to which the units are connected electrically conductively:

a1) a command for reading an address register in at least one of the units that has or have an address, especially a test address, given in the command, especially the command RDREG (<tstadr>.[LBAR]) or TSTPRES (<tstadr>). LBAR may stand for local bus address register.

whereby preferably after the use of the command, a check is made if one of the units answers and wherein allocation is made in different ways depending on having an answer or not, and/or a2) a command, especially TSTPRES(<tstadr>), for testing if at least one of the units has or have an address that is given in the command, whereby the unit that has this address answers with a special token on the bus, especially a PRESENT token, with an out of band signaling, with the address or in another predefined way, whereby preferably after the use of the command, a check is made if one of the units answers and wherein allocation is made in different ways depending on having an answer or not, and/or b) a command that determines an output value that has to be applied to the chain of electronic elements by at least one unit that has an address that is given within the command, especially the command WRREG (<source>.R1), #xxb) or WRBREG((R1), #xxb)(S8I), whereby one bit of the binary value determines that an output mode or an input mode shall be active and whereby another bit of the binary value determines the value of the output, and/or c) a command for reading in values on the ADC of units that have an address that is specified in the command, especially ADC2LBAR(adr) or preferably ADC2LBAR(adr), #xxxxh, whereby especially a bit mask is specified within the command and whereby the bit mask is used for generating preliminary addresses of final addresses.

These commands allow an easy implementation of allocation methods, even of more complex allocation methods.

Schmitt trigger circuits may be used within the units or within a part of the units. The Schmitt trigger circuit may convert an analog input signal into a digital output signal, preferably depending on at least one threshold value or depending on a lower threshold value and on an upper threshold value. The two threshold values may be part of a trigger hysteresis. The digital output signal may have a bit length of 1. In electronics, a Schmitt trigger circuit is a comparator circuit with hysteresis implemented by applying positive feedback to the non-inverting input of a comparator or differential amplifier. It is an active circuit which converts an analog input signal to digital data. A Schmitt trigger (ST) circuit may be cheaper than an ADC. The simplicity of the ST circuit may be compensated by a more sophisticated allocation method, especially be a bisection method that detects the middle of the chain of electronic elements or the position where an electric potential value is half the value of a high potential value, for instance of Vdd. The units within both groups may be addressed differently using the output of the ST circuits as a part of address, especially as a part of a preliminary address.

It is possible to use the hysteresis of the ST circuits to improve the detection of potentials and thereby the allocation of correct addresses. A method may be used that switches the input potential first to low potential and then to high potential before detection is made. This is a kind of shaking and allows for instance to detect signal values that are between the two threshold values. These values are assigned to the upper range in order to allow a unique allocation method. Alternatively, "shaking" high to low may be used. The allocation method may not be time critical because allocation has to be performed only once on power on or only for special error conditions.

The allocation method that uses ST circuits may use a command for writing an address register in units that are addressed by this command, especially the command WRADR_E(<wrkadr>), <tstadr>. At least one bit of the written data may depend on the output value of the Schmitt trigger circuit within the respective unit. By using this command, the units may be divided into at least a first group and a second group depending on the output values of the Schmidt trigger circuits. A bisection method may be performed by dividing the first group or the second group again using the command that writes data depending on output value of the Schmitt trigger circuits. The bisection method may be performed until only one unit is left, for instance a unit at one end of the chain. This unit gets its final address. Using the final address of this unit it is possible to set outputs on the chain of electronic elements, especially outputs that allow repeating the allocation scheme in the same way but without the unit or units that already have their final address. The number of remaining units is reduced by one each time. Thus the active chain of electronic elements may be shortened correspondingly. This allows better or more exact detection in further loops of the method of address allocation. The loops are repeated until all units have their final address.

Also for an allocation method that uses ST circuits at least one, at least two or all of the following commands are used during address allocation, whereby the commands are preferably defined for a wireless transmitting protocol or for a bus transmitting protocol for a bus to which the units are connected electrically conductively:

a) see command a) given for ADC, and/or b) see command b) given for ADC, and/or c) a command for writing an address register in units that are addressed by this command, especially the command WRADR_E(<wrkadr>), <tstadr>, whereby at least one bit of the written data depends on the output value of the Schmitt trigger unit within the respective unit, These commands allow an easy implementation of allocation methods, even of more complex allocation methods.

It is also possible to use other detection circuits instead of ADCs or STs.

Furthermore, a control unit is given, especially a control unit that may be used in a method according to one of the embodiments mentioned above, preferably within an input arrangement, for instance a keyboard, within a chain of optical output elements or within a display. The control unit comprises an internal control unit. The same technical effects that apply to the method and its embodiments also apply to the control unit used for performing the method. The control unit may include a processor that performs commands of a program. Alternatively circuitry without a processor and without using a program may be used, especially an ASIC (Application Specific Integrated Circuit) or an IC (Integrated Circuit).

The internal control unit may control or perform a method for allocation of addresses to a plurality of units using analog to digital converters or Schmitt trigger circuits within the units. The control unit may preferably be connected to at least one end of a chain or of a serial connection of electronic elements, whereby the analog to digital converters or Schmitt trigger circuits are also connected to the chain or to the elements of the serial connection of electronic elements. This allows to use address allocation methods that are robust, fast and easy to implement, especially only in hardware on the sides of the units that get the addresses.

Further a unit is given, especially a unit that is used in a method according to one of the methods mentioned above, preferably within an input arrangement, for instance within a keyboard, within a chain of optical output elements, especially LEDs (Light Emitting Diodes), or within a display, comprising:
- an address register,
- a detection unit, preferably an analog digital converter or a Schmitt trigger circuit, and
- an internal control unit, preferably a state machine.

The same technical effects that apply to the method and its embodiments do also apply to the unit used for performing the method. Especially circuitry without a processor and without using a program may be used for the unit, especially an ASIC (Application Specific Integrated Circuit), i.e. a circuit that has programmed connection between its functional blocks, or an IC (Integrated Circuit). ASICs are simpler and much cheaper than processors. Furthermore, energy consumption is lower. Alternatively, it is also possible to use software components as well. The state machine changes internal states depending on input signals. Output signals are generated in some or all of the internal states. No software is used within state machines.

The detection unit may be electrically connected to a chain of electronic elements, preferably to a serial connection of electronic elements, especially to a serial connection of resistors. It is for instance possible to print the resistors on a carrier of bus wires, for instance using carbon printing. Other technologies may be used as well, for instance SMD (Surface Mounted Device).

The foregoing has outlined rather broadly the features and technical advantages of embodiments of the present invention in order to understand better the detailed description of the invention that follows. Additional features and advantages of embodiments of the invention will be described hereinafter. The embodiments also form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following description taken in conjunction with the accompanying drawings, in which:

FIG. 7 illustrates an example for address allocation.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to implement and use the invention, and do not limit the scope of the invention. Moreover, the same reference signs refer to the same technical features if not stated otherwise. As far as "may" is used in this application it means the possibility of doing so as well as the actual technical implementation. As far as "about" is used in this application, it means that also the exact given value is disclosed. The Figures are not drawn to scale, i.e. there may be other dimensions and proportions of the shown elements.

The present invention will be described with respect to the preferred embodiment in a specific context namely an input arrangement in the form of a keyboard with keys as input elements. The invention may also be applied, however, to other input arrangements.

Figure 1:
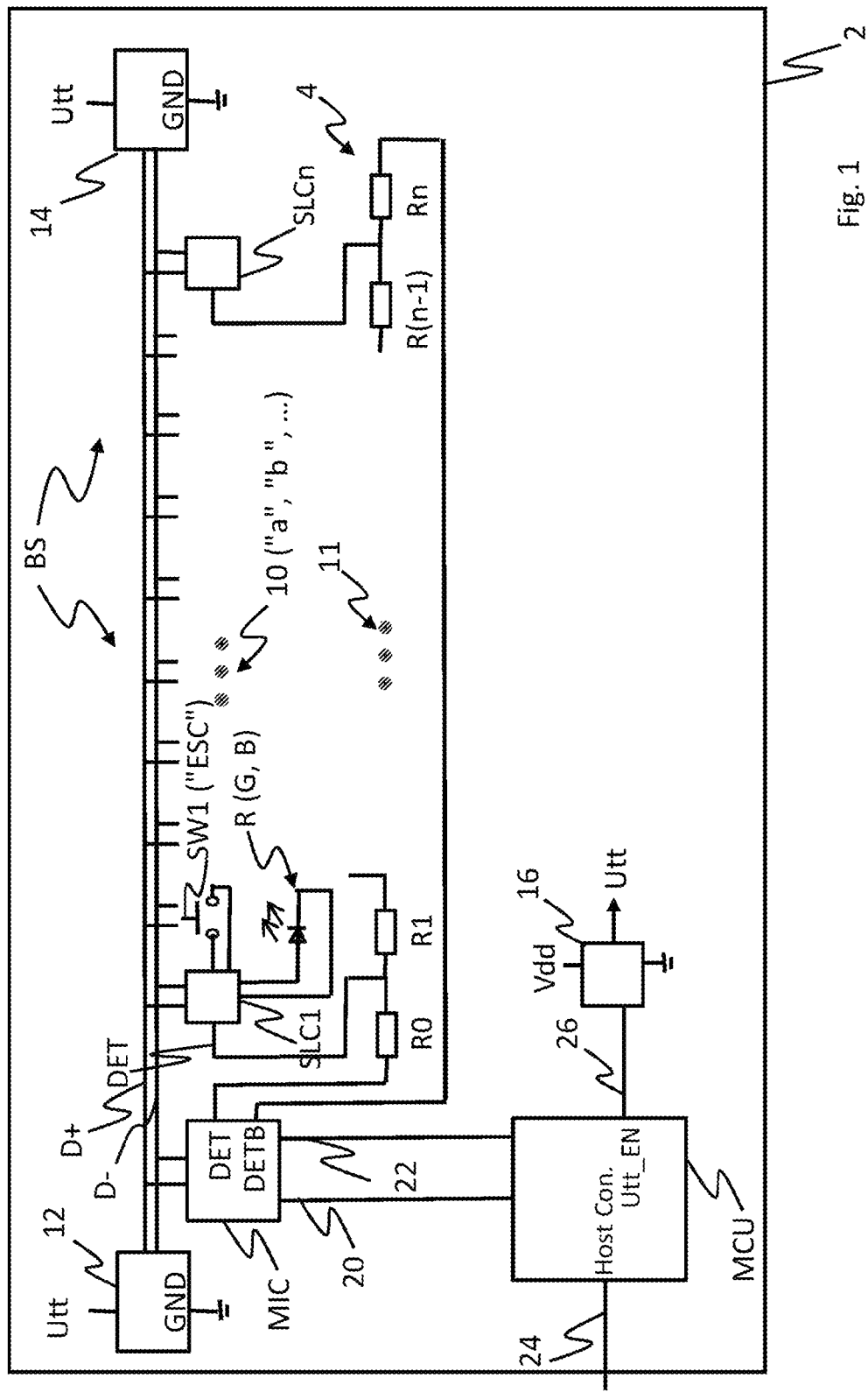
FIG. 1 illustrates a bus topology of a bus system.

FIG. 1 shows a first bus topology of a bus system BS. In the first bus topology there is one bus control unit MIC that is connected with a chain 4 of resistors R0 to Rn all having the same resistive value within the fabrication tolerance. This means that the MIC is able to perform an address allocation method in order to allocate addresses to the SLC after power on.

However there may be a second bus topology where an MCU is connected to chain 4 of resistors R0 to Rn. In this case the MCU controls the allocation of addresses to SLCs. It is possible to have a further tap that goes from the middle of chain 4 to a further input/output pin of the MCU when using the second topology.

A third topology uses one master MIC and several subordinated MICs on bus system BS. This may allow longer bus wires or more SLCs on bus DHIB. The subordinated MICs are also part of chain 4, i.e. their pins DET and DETB are connected to the left or right with resistors.

A fourth topology uses a master MIC and several bridge MICs that are placed between adjacent bus segments of bus system BS and between segments of chain 4. In this topology, line termination units are located at the ends of the wires of the bus of each bus segment. It is possible to have even longer bus systems using bridge MICs.

It is, of course, possible to combine features of the four topologies to get further topologies.

The first bus topology is described in more detail here. The bus system BS is part of a keyboard 2 that comprises more than 100 keys or key switches, one of them shown as switch SW1 on bus unit SLC1. Switch SW1 is for instance the "ESC" (Escape) key. Although the bus DHIB (Differential Host Interface Bus) of bus system BS is shown along a straight line in FIG. 1, it is clear that the bus DHIB changes its direction several times in a real keyboard 2 so that there are several parallel sections of bus DHIB, for instance 5 to 7 parallel sections.

The resistors R0 bis Rn of chain 4 of resistors are connected in a serial connection beginning with R0, then R1 and so on, see further resistors 11, to the last but not least resistor R(n−1) and to the last resistor Rn. The free end of resistor R0 is connected to a DET output of bus control unit MIC. The free end of resistor Rn is connected to a DETB output of bus control unit MIC. Between two adjacent resistors there are respective taps. The tap between R0 and R1 is connected to bus unit SLC1 input/output pin DET (DETermine). The tap between R1 and R2 is connected to a bus unit SLC2 (not shown, see further bus units 10) and so on. The final tap between resistor R(n−1) and Rn is connected to the last bus unit SLCn on the bus DHIB. The ends of chain 4 may be connected to pins DET, DETB on a bus control unit MIC or on the MCU mentioned later.

Push buttons or key switches, for instance switch SW1, are used to make inputs by a user of the keyboard. Each of those switches is connected to a respective bus unit SLC, i.e. switch SW1 to SLC1 and so on. Optionally the key switches may be lighted by LEDs (Light Emitting Diode) in order to enable the use of the keyboard in dark rooms or in darker rooms as well. LED groups of three LEDs red R, green G and blue B may be coupled to each bus unit SLC respectively. It is possible to control the LED groups and the LED within one group independently from the LEDs of other groups or of other LEDs within the same group.

The bus system BS includes:
one bus control unit MIC (MIC—Master Interface Controller) in short MIC,
bus units SLC1 to SLCn (SLC subordinated/SLave controller) in short SLC, for instance between 100 and 200 SLCs or 250 SLCs, and
the bus DHIB (Differential Host Interface Bus) in short DHIB.

The bus DHIB comprises two bus wires D+, D−. Bus wire D+ is for the transmission of the logical positive signal, i.e. it signals a logical 1 with positive potential. Bus wire D− is for the transmission of the negative (logically inverse) signal of the differential signal. The bus units SLC1, 10 to SLCn are electrically conductive connected to the bus wires D+ and D− in parallel connection. This means that all other bus units SLC will still work even if one bus unit SLC does not work properly or does not work at all.

Furthermore, keyboard 2 comprises a processor unit MCU (Microprocessor Control Unit) or in short MCU. Between the MCU and the bus control unit MIC there is an SPI (Serial Peripheral Interface) bus 20, see FIG. 4 for more details. Furthermore, there are control lines 22 between the MCU and the bus control unit MIC. Control lines 22 are also explained in more detail with regard to FIG. 4 below. There is an interface 24, for instance USB (Universal Serial Bus), Bluetooth etc., between the MCU and a further MCU or/and a main processor of a computer. Interface 24 is used to transmit codes that identify the keys of the keyboard 2 that a user of the keyboard has pressed to the main processing unit.

There are two bus termination units 12, 14 at the ends of bus DHIB for line termination, i.e. in order to prevent reflection of signals at the end of the wires D+ and D−. Such reflection would interfere with the transmitted signals. A power unit 16 generates the power, i.e. the power potential Utt, for bus termination units 12, 16. The relevant voltage is derived from ground GND potential and positive potential Vdd. There is an enable line 26 from MCU to power unit 16 that enables or disenables power generation for potential Utt, i.e. for the potential that is relevant for the powering of the line termination units 12 and 14. This may be used for energy saving. Due to biasing termination may use two potentials. While usually the negative one is GND and the positive is Utt there may be applications were it may be necessary to move the potentials either further apart (for instance for a very large DHIB) or closer together (for instance for low power tweaking) which both will result in two distinct termination voltages Utt+ and Utt−.

Figure 2:
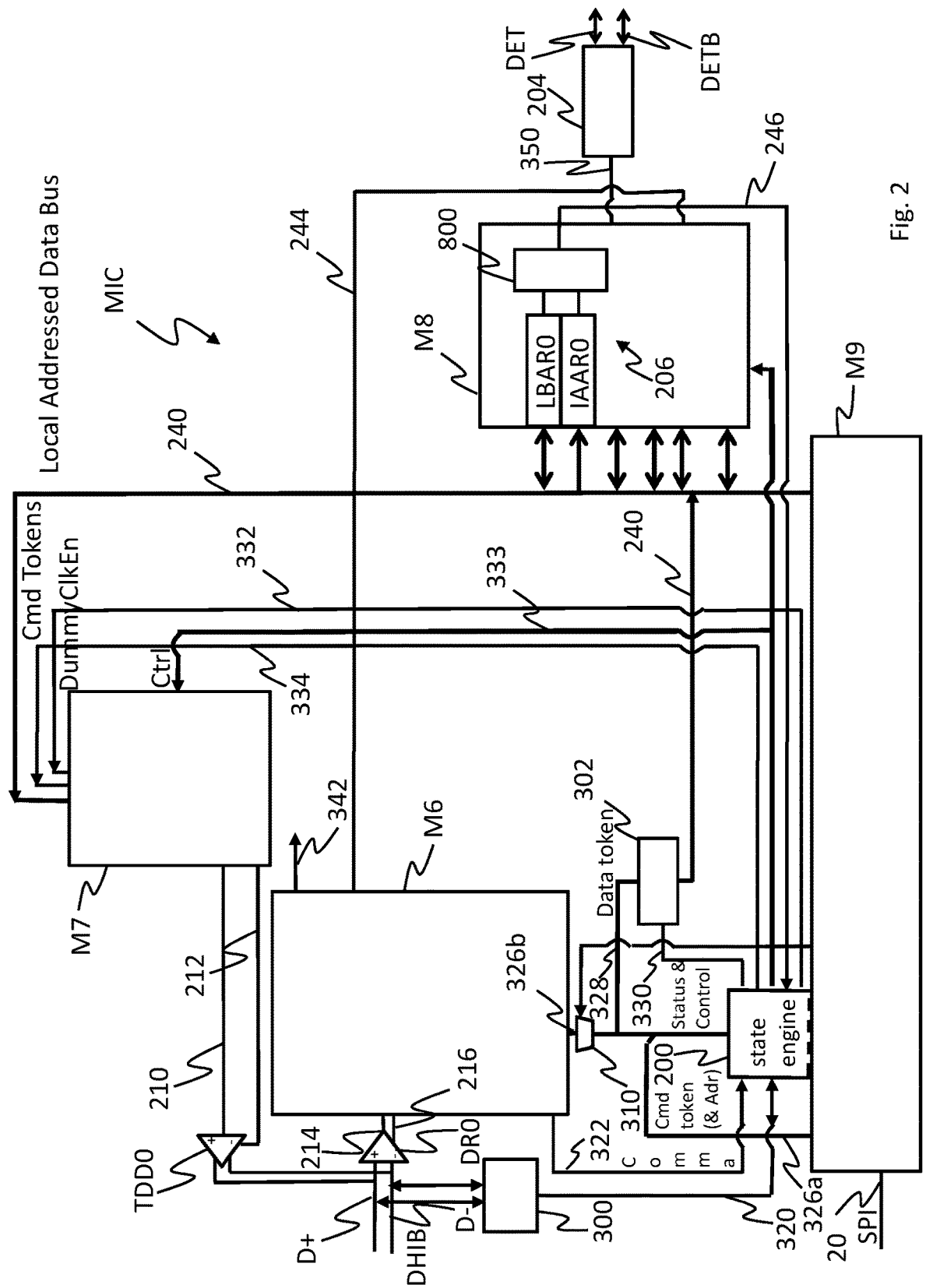
FIG. 2 illustrates sub units of a bus control unit (MIC)
Figure 4:
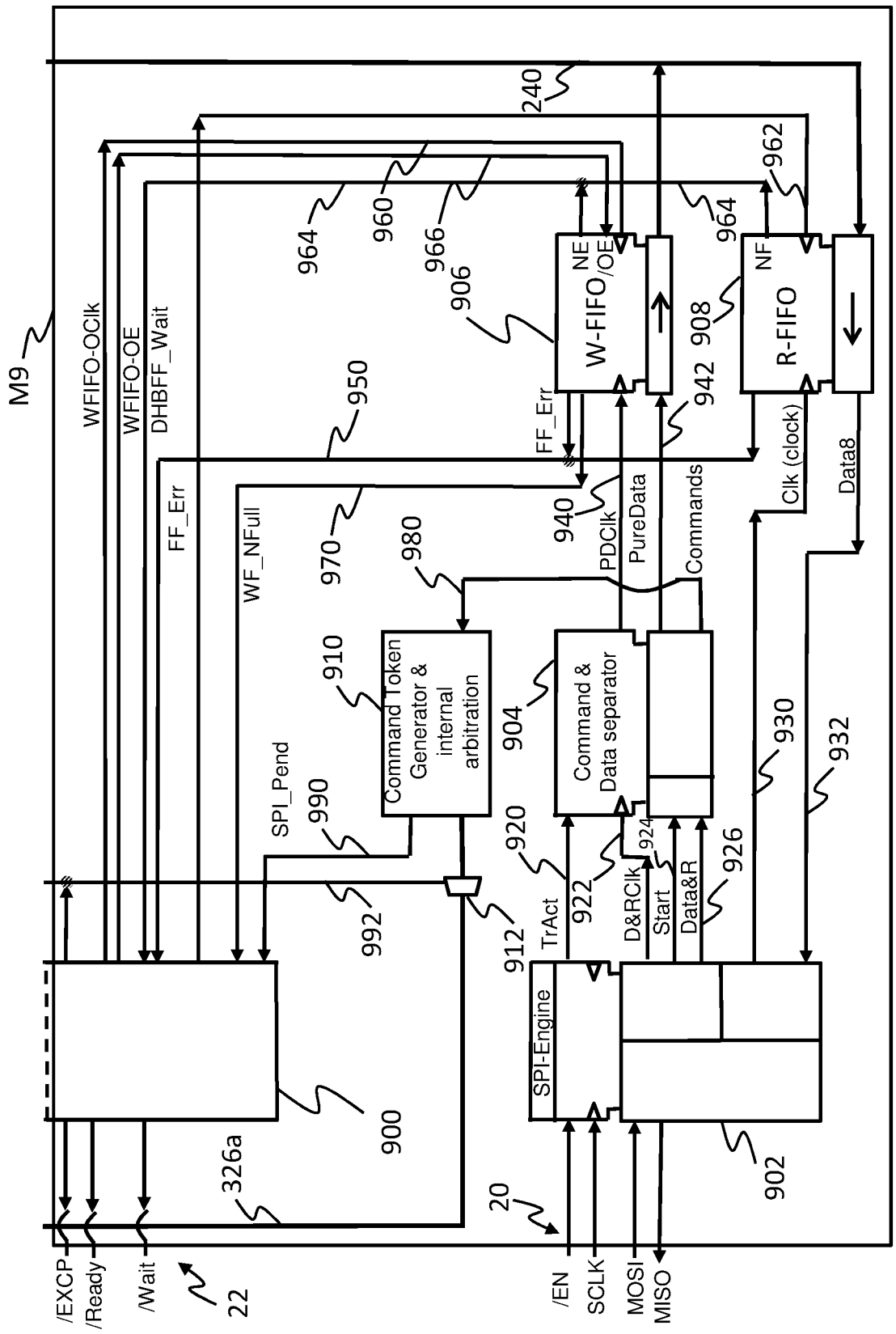
FIG. 4 illustrates sub units of an interface unit within the bus control unit (MIC)

FIG. 2 shows sub units of the bus control unit (MIC):
a state engine 200 of bus control unit MIC that controls the functions of the MIC,
a receiving unit M6 for receiving data and commands from bus DHIB,
a sending unit M7 for sending data and commands to the bus DHIB,
a match and general control unit M8 that is used for implicit addressing and for general control,
an interface unit M9 that comprises an interface to and from the processor unit MCU, see FIG. 4 for more details,
a tristate differential driver TDD0 with special state driving (OOB out of band signaling). The two outputs of TDD0 are connected to bus wires D+ and D−.
a differential receiver DR0 with special state detect. The two inputs of TDD0 are connected to bus wires D+ and D−.
a DET control unit 204 having a first output pin DET that is connected to R0 of chain 4 and a second output pin DETB that is connected to the last resistor Rn of chain 4 enabling the MIC to set the ends of chain 4 to low and high during allocation of addresses to SLCs as described in more detail at the end of the description.
an address and match unit 206 that is used for addressing and that comprises an address register LBAR0 (Local Bus Address Register, however it contains the address that is relevant for bus DHIB) and a counter register IAAR0 (Imminent (upcoming) Address Access Register) as well as a match/compare unit 800. Only the [IAAR] counting may be specific to implicit addressing. The addressing unit as a whole may not be optional, but may be necessary to implement a means of distinguishing the bus stations. Only the IAAR may definitely be optional and LBAR may also be optional, if some sort of "hard wiring" (preprogramming) of the address is used.

There are the following connections between the units of MIC:
data output line 210 for data transmitted to bus DHIB arranged between sending/transmitting unit M7 and input of driver TDD0,
a control line 212 that is between sending unit M7 (may also be named as transmitting unit) and the control input of driver TDD0,
a data input line 214 for data received from bus DHIB arranged between the output of receiver DR0 and receiving unit M6,
a control line 216 from receiving unit to a control input of receiver DR0,
SPI interface lines 20 between processor unit MCU and interface unit M9, see FIG. 4 for more details,
a local addressed data bus 240 that may comprise a data bus and an address bus separated from each other or multiplexed. Bus 240 is between state engine 200, sending unit M7 and the match and general control unit M8.

control lines 244 between receiving unit M6 and unit M8, a match control line 246 between unit M8 and state engine 200 for the signaling of a match of addresses LBAR0, IAAB0 in match unit 800.

Furthermore, bus control unit MIC comprises:

an exception signaling unit 300 having two inputs connected to bus DHIB and being able to detect or to initiate out of band signaling (OOB), a data buffer register 302 for intermediate storing of data tokens received via bus DHIB, a bus gate unit 310 for enabling or disenabling data transfer from receiving unit M6, via received token bus 326*b*, to command token and address bus 326*a* between either receiving unit M6 or command token generator (CTG) unit and internal arbitration unit 900 which is part of interface unit M9 and state engine 200, i.e. for preventing transmission conflicts. This is an enable gate 310. The other source of command tokens is the Command Token Generator (CTG, 900) under control of the SPI engine 902. The state engine 200 may be a pure sink for the commands, i.e. a mere execution unit. Nevertheless state engine 200 may select the source to obtain the next command queued in from: If a command from SPI engine 902 is pending state engine 200 may select CTG as source and on demand even can actively terminate the present command to execute the one from the SPI engine 902. In most modern FPGA (Field Programmable Gate Array) and ASIC (Application Specific Integrated Circuits) implementations "busses" may not be implemented by separate transceivers for each source, but by a multiplexer, which intrinsically prevents conflicts.

a bidirectional signaling line 320 between exception signaling unit 300 and state engine 200. For easier implementation this may be a three line point to point bus, not just one line:

Enable (exception out) signal to the OOB (out of band—signaling) driver, i.e. exception signaling unit 300, OOB signal state indicator (exception in) to the state engine 200, and OOB data line (bidir).

a comma or separator signaling line 322 from receiving unit M6 to state engine 200, the command token and address bus 326*a* for the transmission of command tokens from receiving unit M6 or the command token generator 900 to the state engine 200, the received token and bus 326*b* for the transmission of received tokens from interface unit M9 to state engine 200 and of data and address tokens from receiving unit M6 via data buffer register 302 to local addressed data bus. Any token may consist of 8 bit and may be flagged by a ninth one either as data or as command. An address token thereby may be a data token that due to the preceding command is going to be interpreted as an address or as an extension of a command (flags, etc.) by "addressing" a sub-command. Thereby addresses may mainly be handled by the data paths. They may just be interpreted differently due to the control exerted by the state engine 200. Therefore most address tokens may just be transferred to the [IAAR] or another address related register.

a data token bus 328 for the transmission of data tokens from receiving unit M6 to local addressed data bus 240.

Since on this bus 328 data tokens, which are not being interpreted as command extension, only may originate in receiving unit M6, this bus 328 may also be a branch of received token bus 326*b* rather than of command token and address bus 326*a*. This may be determined by implementation needs.

status and control line(s) 330 between state engine 200 and data buffer register 302, a dummy clock enable line 332 from state engine 200 to sending unit M7 for controlling the generation of dummy clock data on bus DHIB, control lines 333 from state engine 200 to sending (transmitting) unit M7 and match and general control unit M8 for general control purposes, a command token bus line 334 from state engine 200 to sending unit M7 for the transmission of command tokens that shall be transmitted via bus DHIB to the SLCs, a synchronization clock line 342 that transmits a clock signal to all other units of MIC especially while receiving data via bus DHIB. The clock signal is generated inside receiving unit M6.

a bus line 350 between match and general control unit M8 and DET control unit 204 for transmitting data that sets high or low state at the DET and DETB pins of control unit 204.

Figure 3:
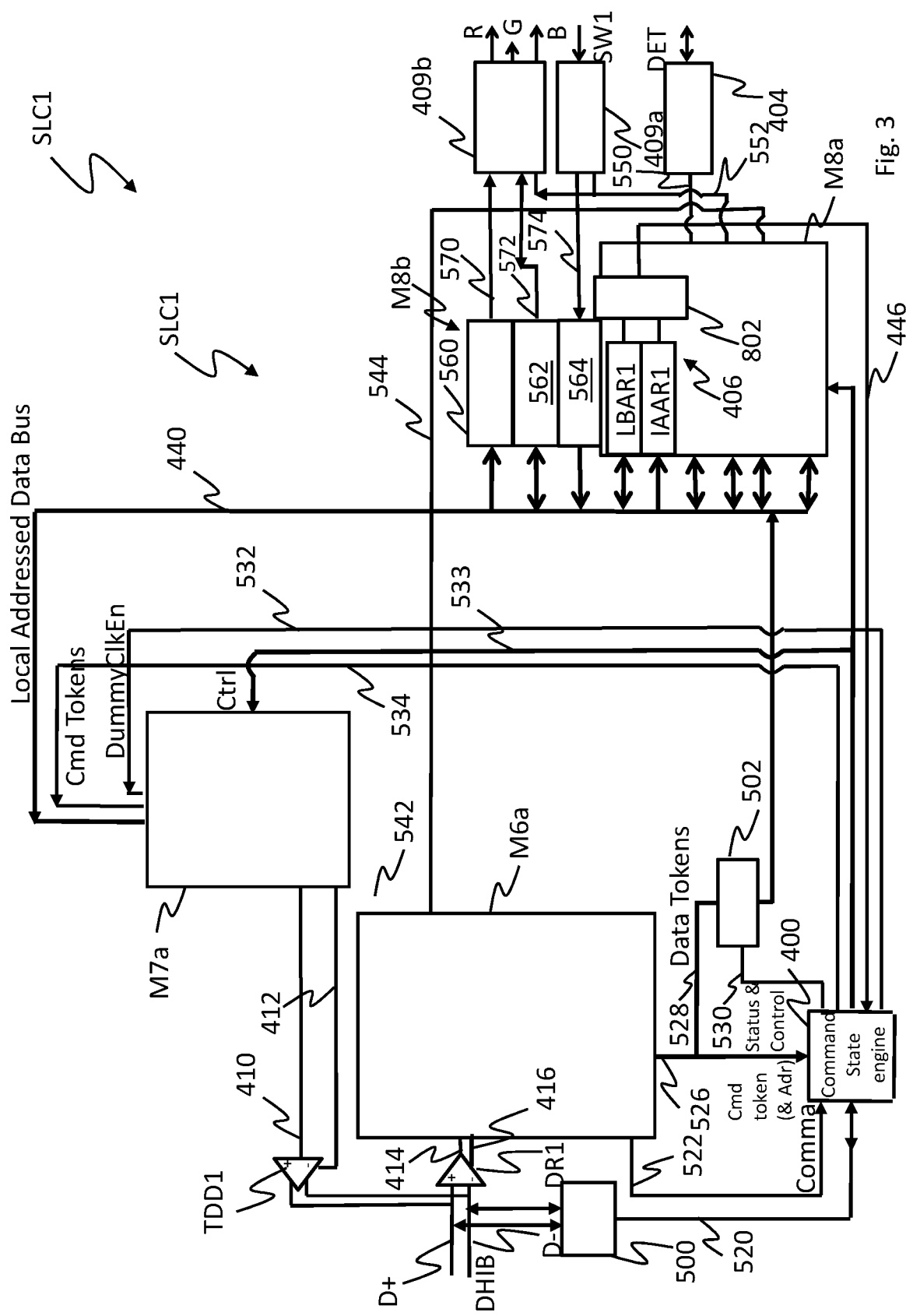
FIG. 3 illustrates sub units of a bus unit (SLC)

FIG. 3 shows sub units of a bus unit (SLC), for instance of SLC1. There are the following similarities between the MIC shown in FIG. 2 and the SLC1 shown in FIG. 3. With regard to the connection of these elements reference is made to the respective elements that have been described with regard to FIG. 2 above. The corresponding elements are shown in round brackets: state engine 400 (SLC) (200 MIC), receiving unit M6*a* (M6), sending unit M7*a* (M7), match and general control unit M8*a* (M8), DET control unit 404 (204), address and match unit 406 (206), address register LBAR1 (LBAR0), counter register IAAR1 (IAAR0), match unit 802 (800), tristate differential driver TDD1 (with special state driving) (TDD0), differential receiver DR1 (with special state detect) (DR0), data output line 410 (to bus) (210), control line 412 (212), data input line 414 (from bus) (214), control line 416 (216), local addressed data bus 440 (data bus and address bus separate or multiplexed) (240), match control line 446 (246), exception signaling unit 500 (300), data buffer register 502 (302), signaling line 520 (320), comma signaling line 522 (322), data token bus 528 (328), status and control line 530 (330), dummy clock enable line 532 (332), control lines 533 (333), command token line 534 (334), synchronization clock 542 (342), connection lines 550 (350).

There are the following differences:

address register LBAR1 (LBAR*n*) and counter register IAAR1 (IAAR*n*) are mandatory, the DET control unit 404 does not have a second input/output pin, i.e. DETB, a switch sample unit 409*a* that is coupled to key switch SW1 and that determines how deep key switch SW1 is pressed down, an LED control engine 409*b* that is coupled to one, two or three LEDs, i.e. a red one R, a green one G and a blue one B, or to more than three LEDs, a command token and address bus 526 from receiving unit M6*a* to state engine 400. There is no bus gate unit in the SLC corresponding to bus gate unit 310. Furthermore, there is no bus that corresponds to bus 326*a* because of missing interface unit M9 in SLCs.

connection lines 552 from unit M8*a* to switch sample unit 409*a* and to LED control engine 409. It is for instance possible to transmit the state of control flags via lines 552.

Furthermore, there is a second part M8*b* of match and general control unit M8*a* of SLC, SLC1 comprising:
- a register 560 (ILPCDR—Intermediate LED (light emitting diode) PWM control register) for controlling PWM (pulse width modulation) of the LEDs R, G and B,
- a register 562 (ILDCDR and LSTAT—Intermediate LED dot correction control register and LED status register) for controlling further functions of the LEDs, i.e. bin correction, on/off etc., and
- a register 564 (ISSOR—Intermediate switch sample output register) that stores the sample value that is sampled from switch SW1 for instance using an ADC.

There is a connection line 570 is between register 560 and LED control engine 409*b*. A further connection line 572 is between register 562 and LED control engine 409*b*. A third connection line 574 is between register 564 and switch sample unit 409*a*. All three registers 560, 562 and 564 are also connected to local addressed data bus 440, i.e. register 560 for write access, register 562 for read or write access and register 560 for read access. Further registers DCR0 to DCR3 of match and general control unit M8*a* and M8*b* will be described below.

The receiving unit M6, M6*a* may include:
- an edge detector and filter unit that receives its input from receiver DR0 or DR1,
- a clock recuperation and synchronization unit that may receive its input from the edge detector and filter unit,
- a phase alignment unit that may receive input from receiver DR0 or DR1 and from clock recuperation and synchronization unit,
- a 10 bit shifter unit that may be coupled to the phase alignment unit,
- a history buffer that may store the previously received symbol,
- a modified 8b/10b decoder, the optional modifications may be made with regard to a decoder as described in the article of A. X. Widmer, Peter A. Franaszek that is mentioned above. Some of the modifications will be explained below in more detail. The modified 8b/10b decoder may receive its input from the 10 bit shifter and from the history buffer.
- a comma detection unit that detects the comma separator of the frames transmitted on bus DHIB and signals its presence to the respective state engine 200 or 400. The comma detection unit may be closely coupled to the modified 8b/10b decoder.
- a command detection unit for detecting commands that have been transmitted via the bus DHIB.

An output of the clock recuperation and synchronization unit may output a synchronization clock on line 342 or 542 for other units of the MIC or SLC. Furthermore clock recuperation and synchronization unit may be coupled to control lines 244 (544). The command detection unit may be coupled to received token bus 326*b* (526).

The sending (transmitting) unit M7, M7*a* may include:
- a data out buffer and special code insertion unit,
- an out FIFO unit that may store 4 tokens for example and that receives its inputs from the data out buffer and special code insertion unit,
- a modified or unmodified 8b/10b encoder unit that receives its input from the out FIFO unit, and
- a 10b (bit) output shifter unit that receives its input from the modified 8b/10b encoder.

The local addressed data bus 240 or 440 is connected to the input of data out buffer and special code insertion unit which also receives command tokens via command token line(s) 332 respectively 532. Dummy clock enable line 332 is also connected with data out buffer and special code insertion unit. The output of the 10b output shifter unit is connected with the input of driver TDD0 or TDD1. All units except the FIFO unit are controlled by the control lines 333.

In addition to the registers LBAR0 (Local Bus Address Register) and IAAR0 (Imminent Access Address Register, counter register) as well as to the match unit 800 the match and general control unit M8 comprises the registers that are mentioned in the following. In addition to the registers LBAR1 (Local Bus Address Register) and IAAR1 (Imminent Access Address Register, counter register) as well as to the match unit 802 the match and general control unit M8*a* also comprises the registers that are mentioned in the following:
- register DCR0 that has a bidirectional connection to DET (Determine) control unit 204 or to DET control unit 404,
- register DCR1 that is connected with lines 552 in unit M8*a*. These may be several lines carrying the control bits from [DCR1]: enable, mode bits, test flags, etc.
- register DCR2 that is connected with control lines 244, 544, and
- register DCR3 that may be used for other purposes.

Local addressed data bus 240, 440 is connected bidirectional, i.e. for sending and receiving, to all four registers DCR0 to DCR3 in both units M8 and M8*a*. Control lines 244, 544 control access to all four registers DCR0 to DCR3 in both units M8 and M8*a* may carry control bits, mostly clock mode controls, from register DCR2 to receiving unit M6 and M6*a* and may allow the read back of some status bits from receiving unit M6, M6*a*.

FIG. 4 shows sub units of an interface unit M9 within the bus control unit (MIC). The interface unit M9 includes:
- a second part 900 of state machine/engine of bus control unit MIC,
- an SPI (Serial Peripheral Interface) engine 902 that is available in the market,
- a command and data separator unit 904,
- an input FIFO 906 (W-FIFO—write First In First Out)
- an output FIFO 908 (R-FIFO—read FIFO),
- a command token generator (CTG) unit and internal arbitration unit 910 creating internal command tokens to be executed by the state engine 200 upon receiving a transfer from SPI engine 902 for the DHIB or for local register access. Some very basic commands may be directly processed by the CTG, 900 by arbitrating internal control lines, for example "hard" resetting the chip. Since the state engine 200 may be built for processing DHIB commands, any command coming in via SPI engine 902 may be translated into an appropriate local command token which may be executed the normal way by the state engine 200, like in an SLC. In order to distinguish those locally created tokens from those received via the DHIB tokens may be used that may have no legal symbol encoding on the DHIB, but nevertheless share most of the bit pattern with their functional DHIB equivalent. In execution there may be no difference except of the data flow: Commands transferring data to DHIB may use the W-FIFO as data source instead of the register file of match and general control unit M8, while commands transferring data from DHIB may use the R-FIFO instead of the register file. Local transfers (between local register file and the SPI engine 902) may replace receiving unit M6 and sending/transmitting unit M7 by the appropriate FIFO. However, a few commands may not fit into this scheme like "RESET", local power down and unlocking setup bits that in their present state are explicitly protected from changing by a DHIB access. These commands may be directly executed by the CTG, 900 by directly arbitrating the appropriate control lines.

a bus gate 912 between the output of unit 910 and command token and address bus 326*a*, an exception output line /EXCP as part of control lines 22, a "ready" output line /Ready as part of control lines 22 a "wait" output line /Wait as part of control lines 22 an "enable" input line /EN as part of the standard SPI interface 20, a clock line SCLK as part of the standard SPI interface 20, an input line MOSI as part of the standard SPI interface 20, an output line MISO as part of the standard SPI interface 20, a transaction indicator line 920 between SPI engine 902 and unit 904 indicating a continuous transaction, a clock line 922 between SPI engine 902 and unit 904, a start signaling line 924 between SPI engine 902 and unit 904, a data line 926 between SPI engine 902 and unit 904, a clock line 930 for R-FIFO 908 between SPI engine 902 and output FIFO 908, a data output line 932 of R-FIFO 908 connected with an input of SPI engine 902, an input clock line 940 of input or W-FIFO 906 coming from command and data separator unit 904, a data input line 942 of input or W-FIFO 906 coming from command and data separator unit 904, an error signaling line 950 (FF_Err) coming from FIFOs 906, 906 and going to the second part 900 of the state engine of the bus control unit MIC signaling an overflow or underflow, an output clock line 960 of W-FIFO 906 going to second part 900 of state engine, an input clock line 962 of R-FIFO 908 coming from second part 900 of state engine, a bus wait line 964 coming from output NE (Nearly empty) of input FIFO 906 and from output NF (Nearly Full) of output FIFO 908 and connected to second part 900 of state machine, i.e. forming a signal DHIBFF_Wait. In FIG. 4 these lines are shown as a "wire or" which may be not available in modern chips any more. So the creation of DHIBFF_Wait probably may be implemented using a "real" or gate.

an output enable/disable line 966 connected to a respective input of W-FIFO 906 for controlling and synchronizing data output to local addressed data bus 240, a control line 970 (WFF_NFull) coming from a respective control output of input FIFO 906 and going to the second part 900 of state engine for signaling that input FIFO 906 is nearly full, a command signal line 980 from command and data separator unit 904 to command token unit and internal arbitration unit 910, a control line 990 (SPI_Pend) from unit 910 to second part 900 of state engine 200 for signaling that SPI data has been received, and bus gate control line 992 from second part 900 of state engine 200 to bus gate 912 for opening or closing this electronic gate 912. Bus control line 992 is also connected to bus gate 310, see FIG. 2.

Local addressed data bus 240 is also connected with data output of input FIFO 906 and with data input of output FIFO 908.

Allocation Methods

There are for instance the following methods for allocating addresses to bus units SLCs and/or to subordinated bus control units MICs at bus DHIB.

First method:
using ADCs within the bus units SLC and/or within the subordinated bus control units MIC and a chain 4 of resistors R0 to Rn,
pull first end of chain 4 to low and pull second end of chain 2 to high potential,
sample all taps of chain 4 at the same time,
use sample values as part of addresses for the SLCs/subordinated MICs, and
optionally, read all possible addresses and rearrange in order to get address space without gaps.

Second Method:
same as first method but partitioning of address space is used in order to form partitions that allow sampling of the values on the taps of resistor chain 4 only for a segment/partition. SLCs in previous partition may pull taps to low and SLCs in following partitions may pull taps to high. The resolution of potential values in the respective "middle" partition is improved considerably reducing detection errors and influence of interference. This may be done for all segments/partitions.

Third Method:
same as second method but with using a uniting of two adjacent partitions combined with sampling of values only within the united partition. This may reduce errors that might arise otherwise during the allocation of addresses, see for instance FIGS. 5A, 5B, 6, 7 and 8.

Fourth method: using Schmitt trigger circuits (ST circuits) on the taps of chain 4 of resistors R0 to Rn. This is described in more detail below with regard to FIGS. 9A to 9E.

Fifth method: Using one of the first to fourth method and storing the addresses that have been allocated in a non-volatile memory for further use after allocation.

Figure 5A:
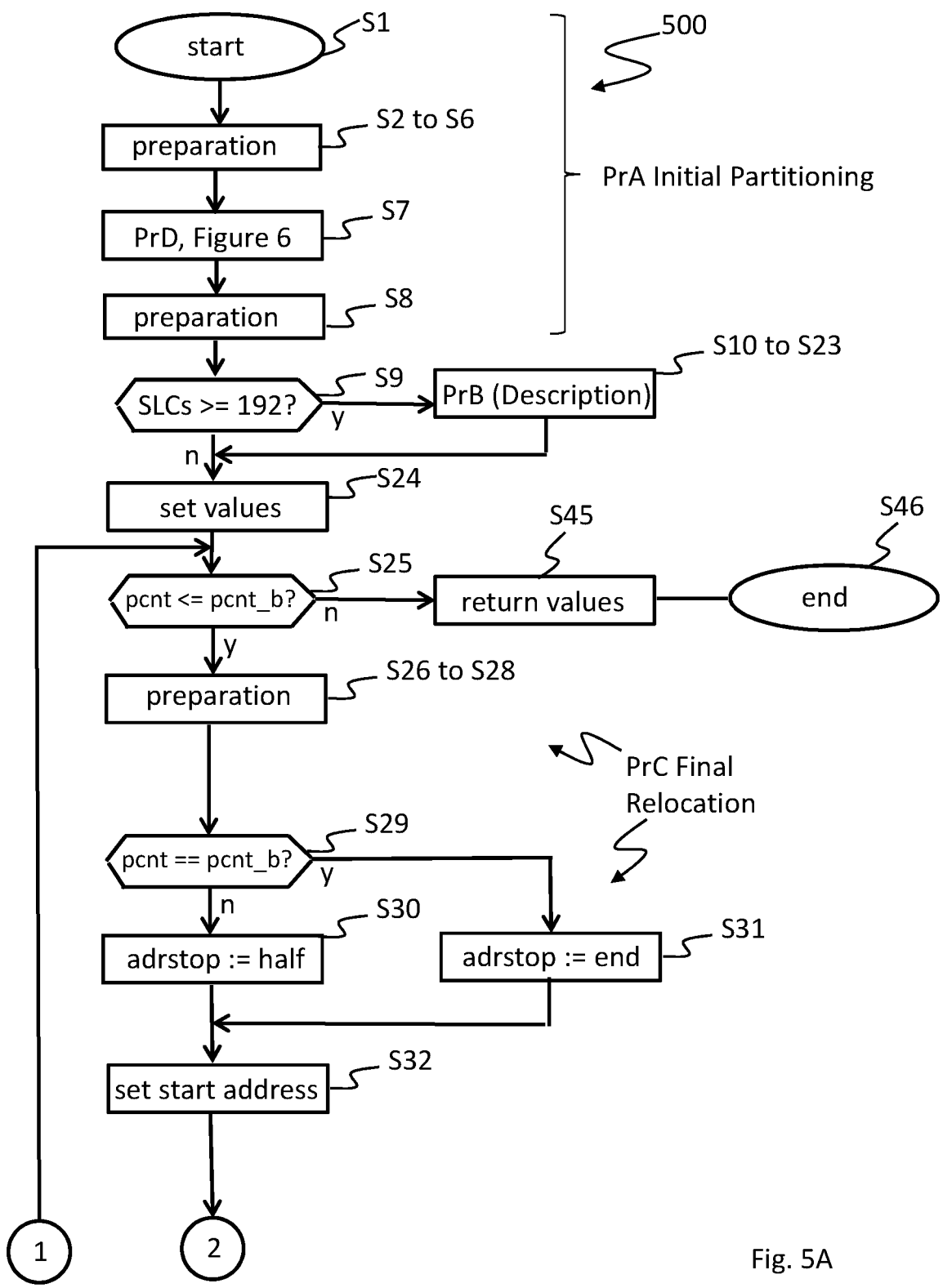
FIGS. 5A and 5B illustrate a process flow for address allocation using ADC circuits within bus units (SLC)
Figure 5B:
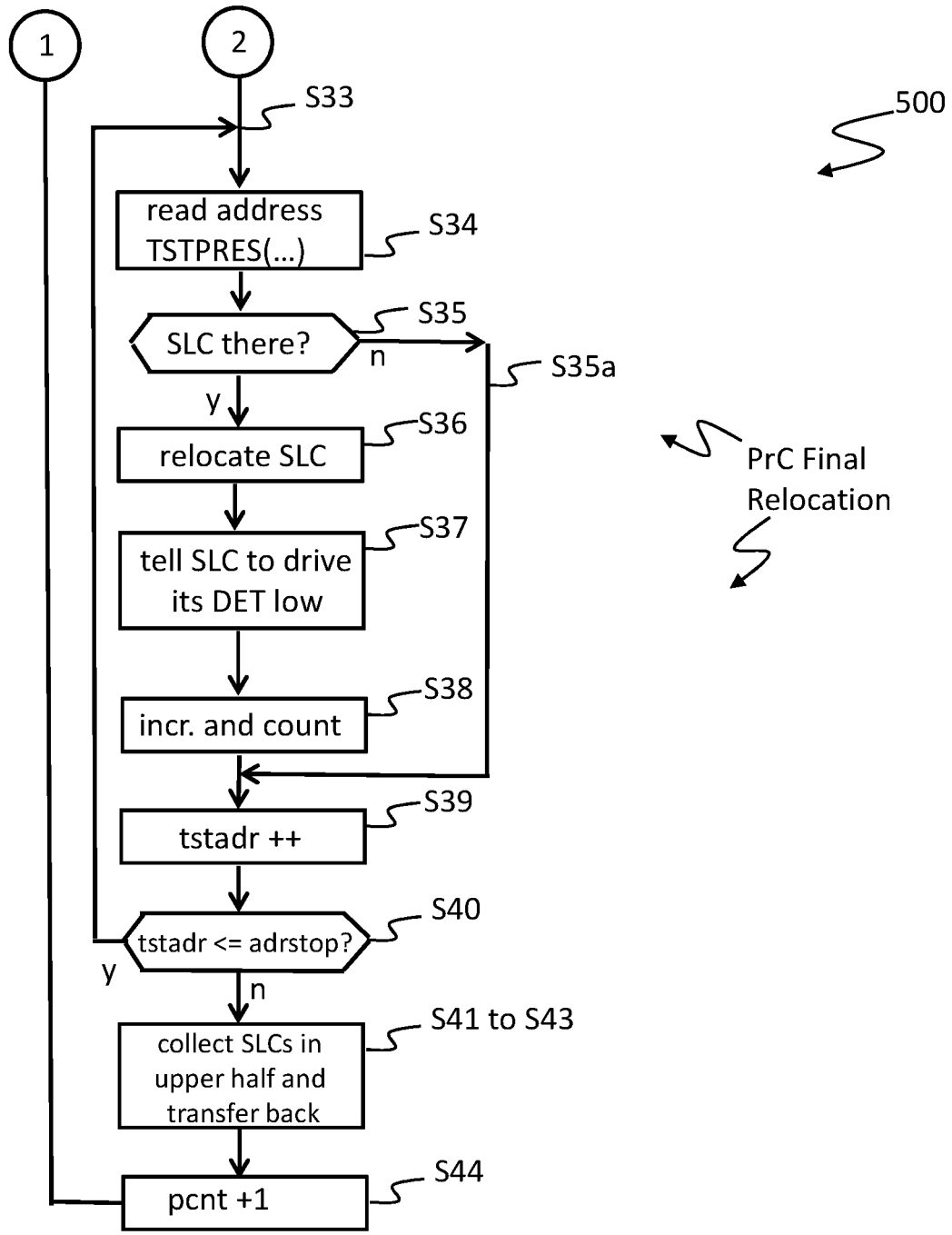
Figure 6:
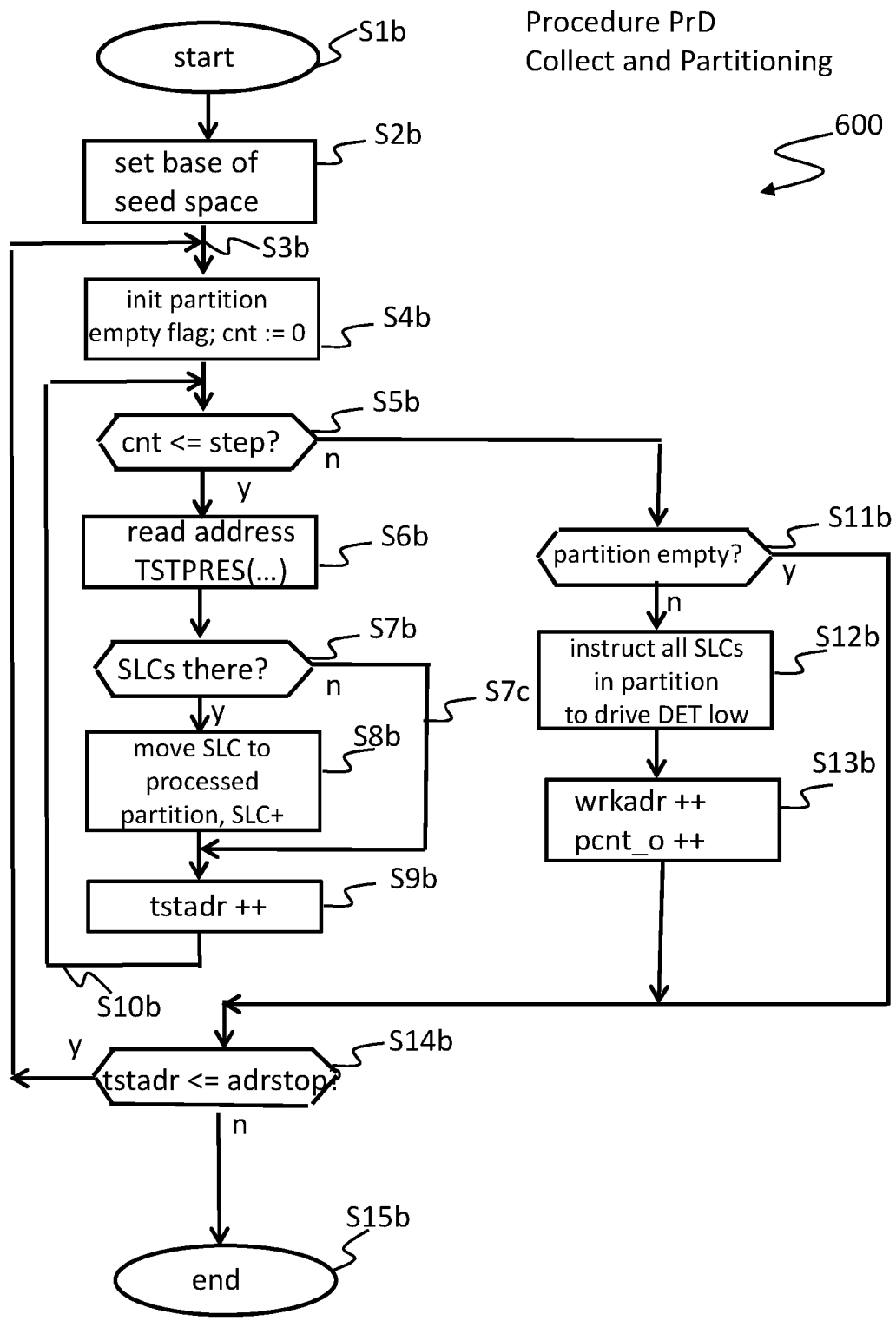
FIG. 6 illustrates a sub process flow for address allocation using ADC circuits within bus units (SLC)

FIGS. 5A, 5B and 6 illustrate a process flow for address allocation using ADC circuits within bus units (SLC). With regard to the third method of address allocation, there are for instance the following four sub procedures:

Procedure PrA: Initial partitioning of the address space to the SLCs, see steps S1 to S8, Procedure PrB: optional intermediate refinement if there are too many SLCs, for instance at least 192 in the example. The steps of procedure PrB are very similar to some of the steps of procedure PrC. Therefore, these steps are not shown in the FIGS. 5A, 5B and 6 but are described after the description of procedure PrC.

Procedure PrC: Final relocation, i.e. allocating the final addresses/identifiers to the SLCs taking care thereby to avoid or compensate detection errors, and Sub procedure PrD: Collect and partitioning. Sub procedure D is called up or performed in procedure PrA and in optional procedure PrB.

The following counters may be used:

<pcnt>: counts the number of partitions (first use as SLC counter) passed to the respective round, <pcnt_o:> counts the number of partitions produced by the respective round, <pcnt_p> Buffers the numbers of partitions produced by previous round, and <cnt>, <cnt2>, <cnt3>, etc. local loop counters.

Procedure PrA (Initial Partitioning)

step S1 (start): For instance: begin enumeration by MCU
step S2 to S6 (preparation):
step S2: All SLCs release DET and reset their address for instance to #FFFFh. For instance: Send RESET command, for instance by MIC or MCU.
step S3: All SLCs will sample DET pin as high. For instance: Host, i.e. MCU or MIC, pulls both chain ends high.
step S4: DET input values are now increasing from the beginning to the end of the chain. For instance: Host pulls near chain end low.
step S5: SLCs [LBAR]s are seeded with ADC values sampled from the DET pins. SLC addresses will be situated/located at #Exxx with "xxx" from ADC. For instance: ADC2LBAR (#FFFFh), #E . . . h, i.e. bit masking is used.
step S6: Set parameters for procedure PrD (collection and partitioning). For instance: <adrstop>:=#EFFFh; <wrkadr>:=#F000h, <pcnt_o>:=0; <pcnt>:=0; <step>:=#7Fh (dezimal:127)
step S7 (procedure PrD, see FIG. 6): Collects from seed at #E000h and distributes addresses to 16 sequential partitions. Another number of partitions is also possible. Does the partitioning all in one run, i.e. with <adrstop> set at end of seed.
step S8 (preparation):
step S8I: For instance: <source>:=#F000h
Set start address of input partitions for the next step.
step S8II: For instance: WRBCREG(R1), #11 . . . b;
Instructs all SLCs to drive logical 1 on DET
step S9 (SLCs >=192?): For instance: <pcnt>>=192?
Too many SLCs for 16 partitions? Intermediate partitioning step needed?
If yes, the next step is in procedure PrB. If no, the next step is in procedure PrC.
Optional Procedure PrB (Intermediate Refinement)
step S10 to S23: The steps of procedure PrB are very similar to some of the steps of procedure PrC. Therefore, these steps are not shown in the Figures but are described after the description of procedure PrC. This procedure PrB may be optional for small systems with less than 200 or less than 250 SLCs.
Procedure PrC (Final Relocation)
The final relocation to destination addresses is necessary since the previous steps have piled up the SLCs addresses into "partitions" that have to be redistributed.
step S24 (set values): Set parameters for final relocation, initialize counters.
For instance: <wrkadr>:=#0000h, <pcnt_b>:=<pcnt>; <counter>:=0
step S25 (pcnt <=pcnt_b?): Process all partitions (only up to 16 or up to 256) created by partitioning runs. For instance: Begin: Distribute_F; for (<pcnt>:=1; <pcnt><=<pcnt_b>; <pcnt>++), i.e. the counter starts at 1 and is incremented by one each time the loop begins again until the value of pcnt_b is reached.
step S45 (return values): Gives back number of processed SLCs, number of partitions, etc. For instance: Return values: <counter>, <pcnt>, Error Flags, Mark last SLC by respective flag.
step S46 (end): For instance: All Enumerated END
step S26 to S28 (preparation):
step S26: Unites next block to <source> space. For instance: WRADR(<source>+ <pcnt>), <source>
step S27: Set DET pins output off, i.e. to input.
For instance: WRREG(<wrkadr>.R1), #00 . . . b
step S28: Seed to #E . . . h space. For instance: ADC2LBAR (<source>), #Eh
step S29 (pcnt==pcnt_b?): Is it the last partition? If yes, go to the end of the partition. If no, leave the upper part for the next loop. For instance: <pcnt>==<pcnt_b?>
If no, step S30 follows. If yes, step S31 follows.
step S30 (adrstop:=half): For instance: <adrstop>:=#E7FFh
step S31 (adrstop:=end): For instance: <adrstop>:=#EFFFh
step S32 (set start address): Sets start at #E000h for collection and relocation of SLC addresses that have been seeded. For instance:
<tstadr>:=#E000h
step S33 (Do): Loop relocates one complete seed to final addresses. For instance: Begin: Distribute_FL, DO.
step S34 (read address TSTPRES( . . . )): Read address. For instance: TSTPRES(<tstadr>)
step S35 (SLC there?): Is there an SLC with this address? For instance: Is signaling present? If yes, step S36 follows. If no (S35a), step S39 follows.
step S36 (relocate SLC): Relocates the SLC address that has the current value of tstadr with the current value of wrkadr. For instance: WRADR (<tstadr>), <wrkadr>;
step S37 (tell SLC to drive its DET low): Tells SLC on current wrkadr to drive its DET to low. For instance: WRREG(<wrkadr>.R1), #10 . . . b (binary)
step S38 (increment and count): Increments relocation target address and counts up number of processed SLCs by one. For instance: <wrkadr> ++; <counter> ++
step S39 (tstadr++): Increments value of test address. For instance: <tstadr> ++
step S40 (tstadr <adrstop?): For instance: While<tstadr><<adrstop> redo Distribute_FL.
If condition is fulfilled, a further loop of steps S33 to S40 is performed. If not, step S41 follows directly.
step S41 to S43 (collect SLCs in upper half and transfer back): Collects all remaining SLC addresses from the upper half of address space and transfers them back to <source> address.
step S41: For instance: Begin: HighCollect3; for (<cnt3>:=E800h; <cnt3><=#EFFFh; <cnt3>++), i.e. the counter starts at #E800h and is incremented to #EFFFh by value one each time the loop begins again.
step S42: For instance: WRADR(<cnt3>), <source>;
step S43: For instance: Next <cnt3>; i.e. (Next HighCollect3)
Next step is S41. If the end of the loop is reached, step S44 follows.
step S44 (pcnt+1): For instance: Next <pcnt>; i.e. (Next Distribute_F)
Next step is S25. If end of loop, step S45 follows.
step S45 (return values): Gives back number of processed SLCs, number of partitions, etc. For instance: Return values: <counter>, <pcnt>, Error Flags, mark last SLC by respective flag.
step S46 (end): For instance: All Enumerated END
Procedure PrB (Intermediate Refinement)—Details
As mentioned above, the steps of procedure PrB are very similar to some of the steps of procedure PrC. Therefore, these steps are not shown in the Figures but are described in the following:
step S10: similar to step S24 but the working address is different, for instance #F200h. The register named counter is not used but two counters pcnt and pcnt_o are used both having the start value of zero.

step S11: similar to step S25 but it is named "repartition" instead of "distribute_F". Counter cnt2 is used instead of partition pointer pcnt. The start value of counter cnt2 is one. The loop that starts in step S11 processes all partitions (e.g. up to 16) that were created by the initial partitioning run.

step S12: similar to step S26 but counter cnt2 is used instead of partition counter pcnt.

step S13: similar to step S27 but source address is used instead of wrkadr (work address).

step S14: similar to step S28.

step S15: similar to step S29 but counter cnt2 is used instead of partition counter pcnt.

step S16: similar to step S30 but the value of the variable step is also set to #7Fh (hexadecimal, i.e. decimal: 7*16+15=127) additional to adrstop:=#E7FFh.

step S17: similar to step S31 but step is also set to #FFh (hexadecimal, i.e. decimal: 256) additional to adrstop:=#EFFFh.

Step S18: procedure PrD is called up, see FIG. 6. It collects from ADC inputs seed values at #E000h and distributes the seed values to 16 refined partitions. Another number of refined partitions is possible as well. This will be repeated up to 16 times to create up to 256 partitions.

The loop that starts in step S11 continues with an inner loop:

step S19: similar to step S41, step S20: similar to step S42, and step S21: similar to step S43.

This inner loop of steps S19 to S21 collects all remaining SLCs, i.e. SLC preliminary addresses, from the upper half and transfers them back to <source>, i.e. to the address that is specified by the source variable.

The loop that starts in step S11 closes with step S22: similar to step S44 but counter cnt2 is used instead of counter pcnt. If the loop that starts in step S11 continues counter cnt2 is incremented, i.e. by one, and step S12 follows again. If the loop that starts in step S11 finishes step S23 is the next step.

Step 23I: Instructs all bus units SLC to drive logical 1 on DET pin, for instance using the following command on bus DHIB: WRBCREG(R1), #11 . . . b;

Step 23II: Sets the start address of input partitions for the next step, for instance by setting source value to #F200h, i.e. <source>:=#F200h (content of register source is #F200h).

The next step is step 24, i.e. procedure PrC starts and the final relocation is made as described above.

Procedure PrD (Collect and Partitioning)

FIG. 6 illustrates a sub process PrD (Collect and partitioning) flow for address allocation using ADC circuits within bus units (SLC).

step S1b (start): For instance: Procedure collect and partitioning begin step S2b (set base of seed space): Set base address of seed space. For instance: <tstadr>:=#E000h step S3b (Do): Moves through seed address space. For instance: Begin: Collect1_O DO step S4b (init partition empty flag; cnt:=0): inits or sets partition empty flag to true. For instance: <pempty>:=true step S5b (cnt <=step?): Moves through one seed address space segment. For instance: Begin: Collect1_I for (<cnt>:=0; <cnt><=<step>; <cnt> ++), i.e. as long as counter value of cnt is smaller or equal to the value of the step variable count up counter variable cnt from 0 incrementing it by one each time the loop starts. If counter value cnt is smaller than or equal to value of variable step, i.e. #7Fh or #FFh (for last partition) in the example, steps S6b to S10b follow. If not, step S11b follows immediately.

step S6b (read address, TSTPRES ( . . . )): Read current test address. For instance: TSTPRES (<tstadr>)

step S7b (SLC(s) there?): Are there SLCs with the current value of test address tstadr? For instance: MIC/MCU checks if signaling of such an SLC is detectable on bus DHIB. If yes, step S8b follows. If no (S8c), step S9b follows without performing step S8b.

step S8b (move SLC to processed partition, SLC+): Moves SLC(s) to processed partition in address space, sets partition empty flag to false and increments SLC counter, i.e. how many bus units SLC have been found. For instance: WRADR(<tstadr>), <wrkadr>; <pempty>:=false; <pcnt> ++ step S9b (tstadr++): Increments the address that is checked in seed address space. For instance: <tstadr>++ step S10b (next): Next loop of steps S5b to S10b if counter <cnt> is smaller than or equal to value of <step>, see procedure PrA, step S6, or procedure PrB, steps S16 and S17. If value of counter cnt is greater than value of variable step, step S11b follows immediately after step S10b, i.e. no further loop of steps S5b to S10b.

step S11b (partition empty?): Tests for empty partition and dumps (rejects) it if it is empty. For instance: <pempty>==<true>?

If yes, step S14b follows directly after step S11. If not, step S12b follows after step S11b.

step S12b (instruct all SLCs in partition to drive DET low): Instructs all SLCs in partition to drive DET low. For instance: WRREG (<wrkadr>.R1), #01 . . . b; i.e. first digit of binary value gives value to set, i.e. here 0, i.e. low, and second digit of binary value 1 stands for "set DET pin" to output. The other digits of the binary value are not relevant and are replaced by dots. The letter b stands for binary.

step S13b (wrkadr ++, pcnt_o ++): Prepares loop for next partition of address space and increments partitions found by one. For instance: <wrkadr> ++, <pcnt_o> ++ step S14b (tstadr <=adrstop?): Tests if value of tstadr is smaller than or equal to adrstop. For instance: While <tstadr><=<adrstop> redo Collect1_O If condition is fulfilled, a further loop of steps S3b to S14b is performed. If not, step S15b follows directly after step S14b.

step S15b (end): end of procedure PrD. For instance: Procedure collect and partitioning END FIG. 7 illustrates an example for address allocation using ADCs. The steps that are mentioned refer to the steps that are shown in FIGS. 5A, 5B and 6. The example shown in FIG. 7 relates to only four segments/partitions SE1 to SE4 although the example of FIGS. 5A, 5B and 6 relates to up to 16 or up to 256 partitions. Other examples may relate to more than 256 partitions or to less than 256 or even to less than 16 partitions. Thus the example of FIG. 7 uses a first simplification in order to ease understanding of the method of address allocation that is proposed here. A further simplification relates to the lengths of the segments or partitions SE1 to SE4, i.e. only four addresses of SLCs are used in one segment or partition. In the example of FIGS. 5A, 5B and 6 there may be 4096 different addresses within one segment. This corresponds to an ADC having 12 bits. Other examples may use more or less different addresses.

As shown in FIG. 7 it is assumed that there are only 16 bus units SLC1 to SLC16 on bus DHIB. The addresses in register LBAR of all bus units SLC1 to SLC16 are set to #FFFFh (#stands for value, and h stands for hexadecimal) or 65536, i.e. 64k (kilobit) in step S2 of Procedure PrA.

As further shown in FIG. 7, step S4 sets the first end of chain 4 of resistors to low potential, e.g. to 0 Volt and the second end of chain 4 is set to high potential, e.g. to 3.4 Volt. However, 3.3 Volt is more realistic but makes the example more complicated. This results in principle in an increasing potential on the DET pins of the sixteen bus units SLC1 to SLC16, i.e. 0.2 Volt, 0.4 Volt, 0.6 Volt and so on to 2.8 Volt, 3.0 Volt and 3.2 Volt if there are no errors. However, in reality there is interference, i.e. EMI, there are tolerances within the resistors R1 to Rn of the chain 4 of resistors, there may be detection errors within the ADC and so on. The proposed method is designed robust enough to handle these errors. It is assumed that there are two errors in the example, namely on SLC5 that will detect 0.6 Volt instead of the "right" value 1.0 Volt and on SLC7 that will detect 1.2 Volt instead of the "right" value 1.4 Volt. Again this is a simplification. In reality the errors would also have an influence on the detected values on further SLCs.

In procedure PrA, step S5, the actual values of potentials are detected by the ADC within the SLCs using for instance a mask value #E . . . h for the most significant bits that results in seed addresses that begin for instance at #E000h. It is assumed in the example that a potential difference of 0.2 Volt "translates" to an address increment of 2. Therefore, SLC1 has now address #E002h in its LBAR register. SLC2 has now address #E004h in its LBAR register, and so on to SLC16 that has address #E020h in its LBAR register. With regard to the two errors there are also two errors for the address in SLC5 that has address #E006h that is the same as the address of SLC3, i.e. of an SLC that has an address within a different address segment SE1 or within a different address partition. Furthermore, SLC7 has address #E00Ch that is the same as the address of SLC6, i.e. of an SLC that has an address within the same address segment SE2 or within the same address partition.

According to procedure PrA, step S6, the working address wrkadr is set to #F000h and the test address tstadr is set to #E000h. Then procedure PrD is called up in step S7. FIG. 7 shows the result in the line that begins with S8b. Step 8b is performed several times for each partition SE1 to SE4. In step S8, the SLCs get a new address in the working address space that begins at #F000h. The first address of working address space is used for the first partition SE1, i.e. working address #F000h and assigned as current address of SLC1, SLC2, SLC3, SLC4 and also to SLC5 that wrongly has an address within the address space of the first partition SE1. The second address of working address space is used for the second partition SE2, i.e. working address #F001h. The third address of working address space is used for the third partition SE3, i.e. working address #F002h. The fourth address of working address space is used for the second partition SE4, i.e. working address #F003h, and so on if more partitions are included within the method 500, 600.

Furthermore, the method performs step S12b and sets the DET pins of the SLC that have been found to low potential, i.e. to 0 Volt. However, this step is particularly relevant for procedure PrB where not all SLCs are included in one call up of procedure PrD but only the SLCs having addresses within one main partition.

Step S8I sets the source address to #F000h. Step S8II sets the DET pins of all SLCs to 1, i.e. to high potential, for instance to 3.4 Volt, using a broadcast message.

There were only 16 SLCs found in the example. Therefore the method decides in step S9 to go directly to procedure PrC without performing procedure PrB.

Step S24 sets the working address wrkadr to #0000h, i.e. the first address of the final address space.

Step S26 unites two segments/partitions of the address space by overwriting addresses that have the address of source, i.e. #F000h+the value of the current partition, i.e. in the first loop of steps S25 to S42 addresses #F001h are overwritten with the source space address, i.e. #F000h in the example. Thus SLC5 to SLC8 get a new address #F000h in their LBAR. All SLCs of the first partition SE1 and of the second partition SE2 now have the same address #F000h. That is what is meant by uniting two partitions. The advantage of this uniting will be visible in the next steps that are shown in FIG. 8.

Figure 8:
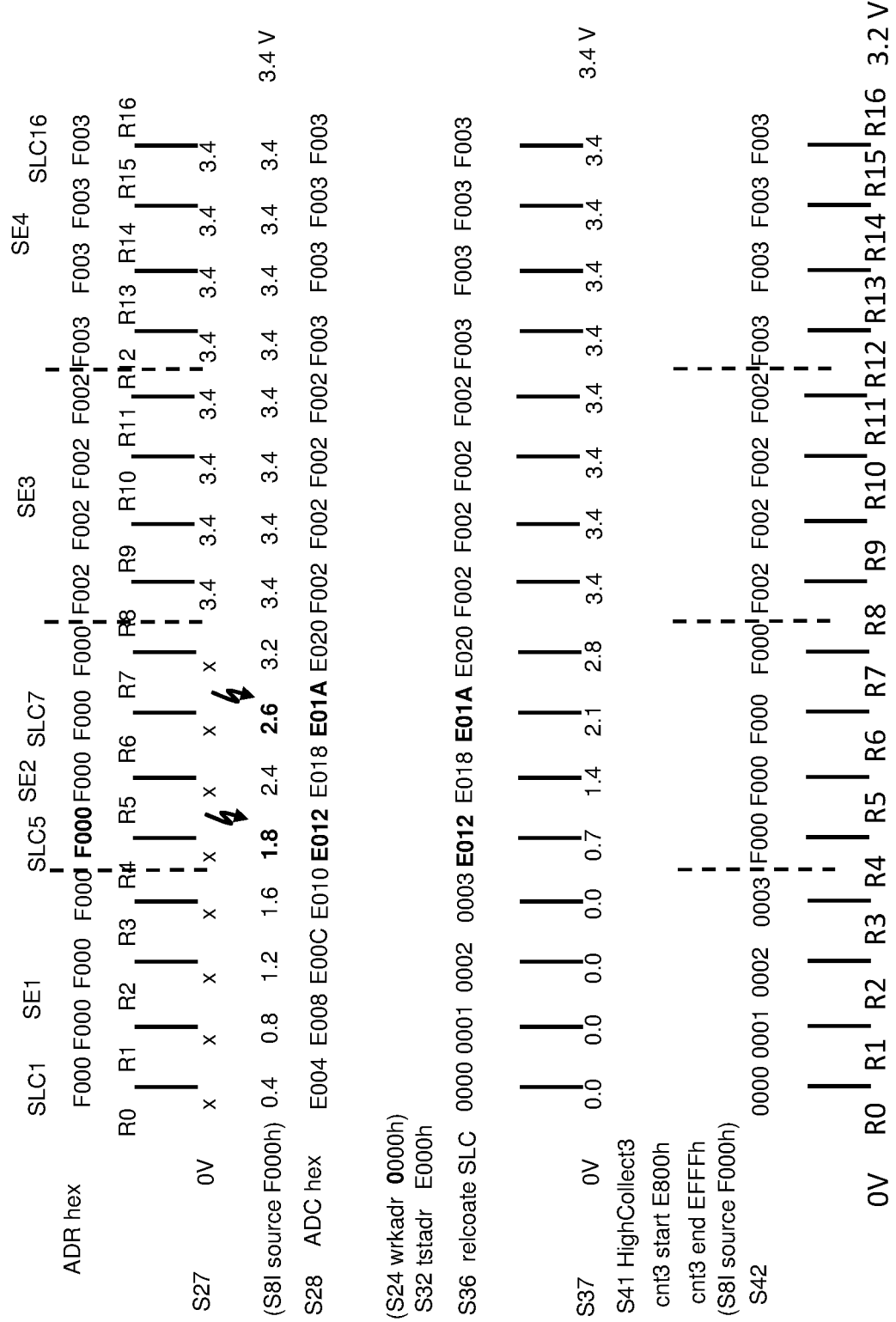
FIG. 8 illustrates further steps of the example for address allocation.
Figure 9A:
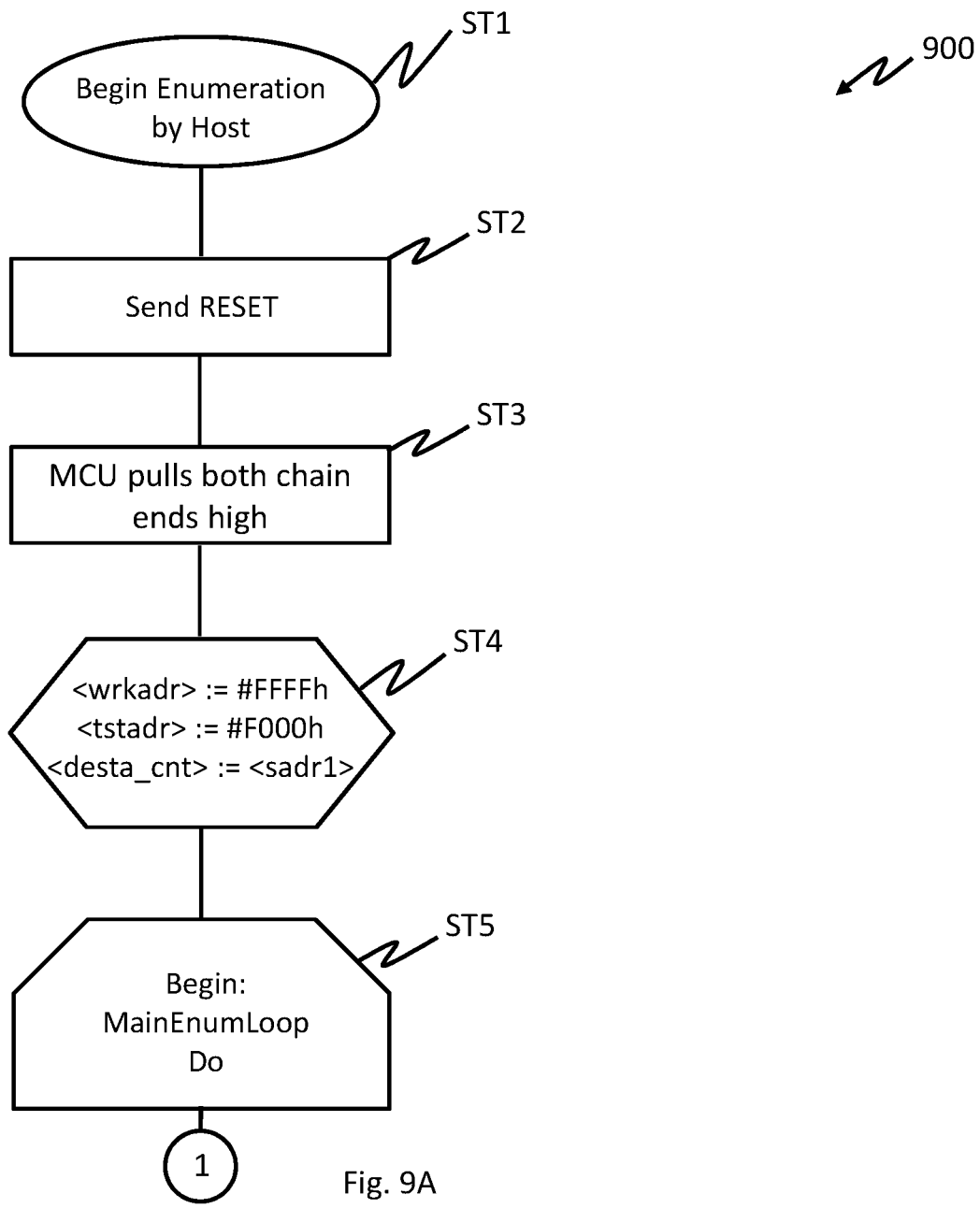
FIGS. 9A to 9E illustrate a process flow for address allocation using Schmitt trigger circuits (ST circuits) within bus units (SLC).
Figure 9B:
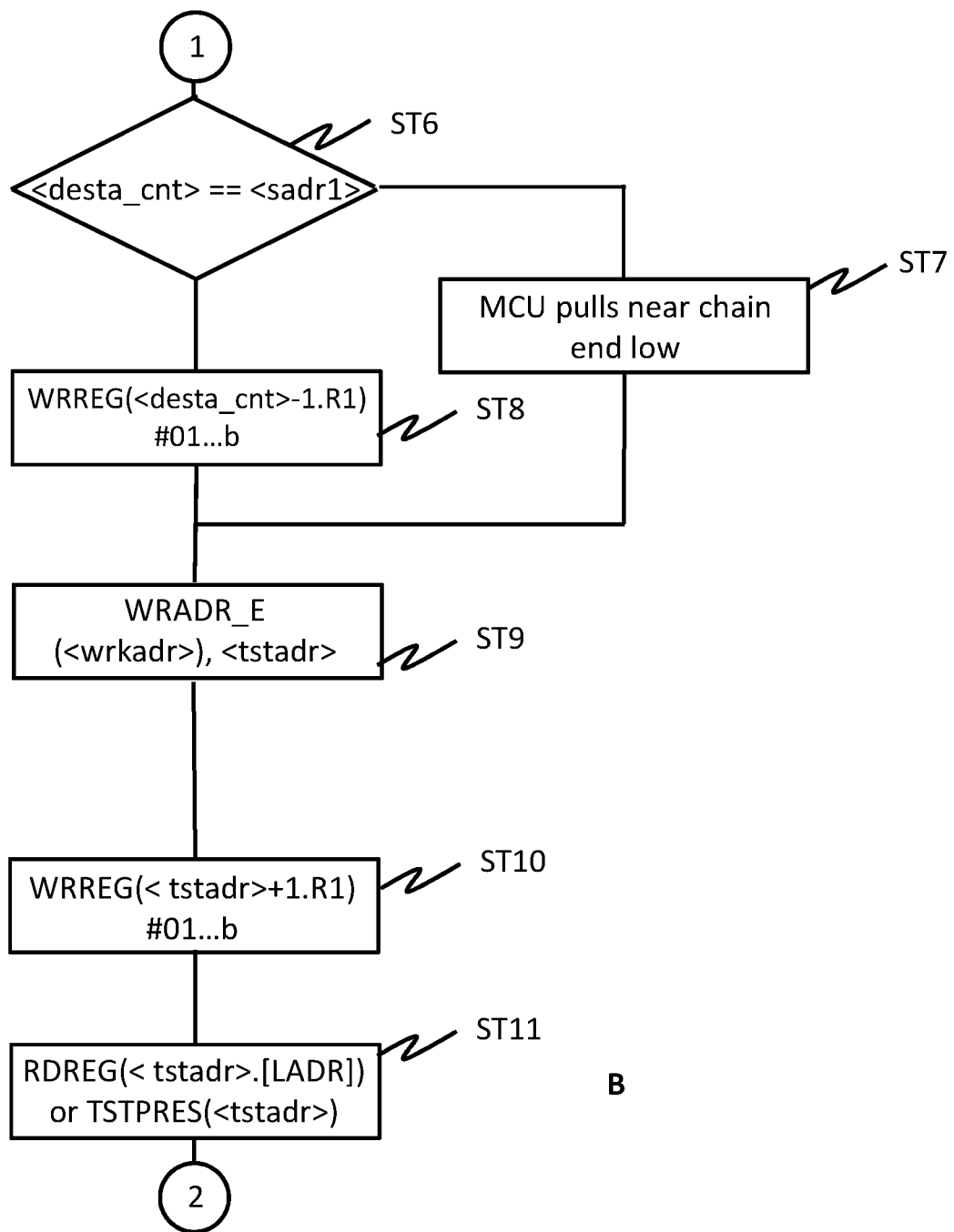
Figure 9C:
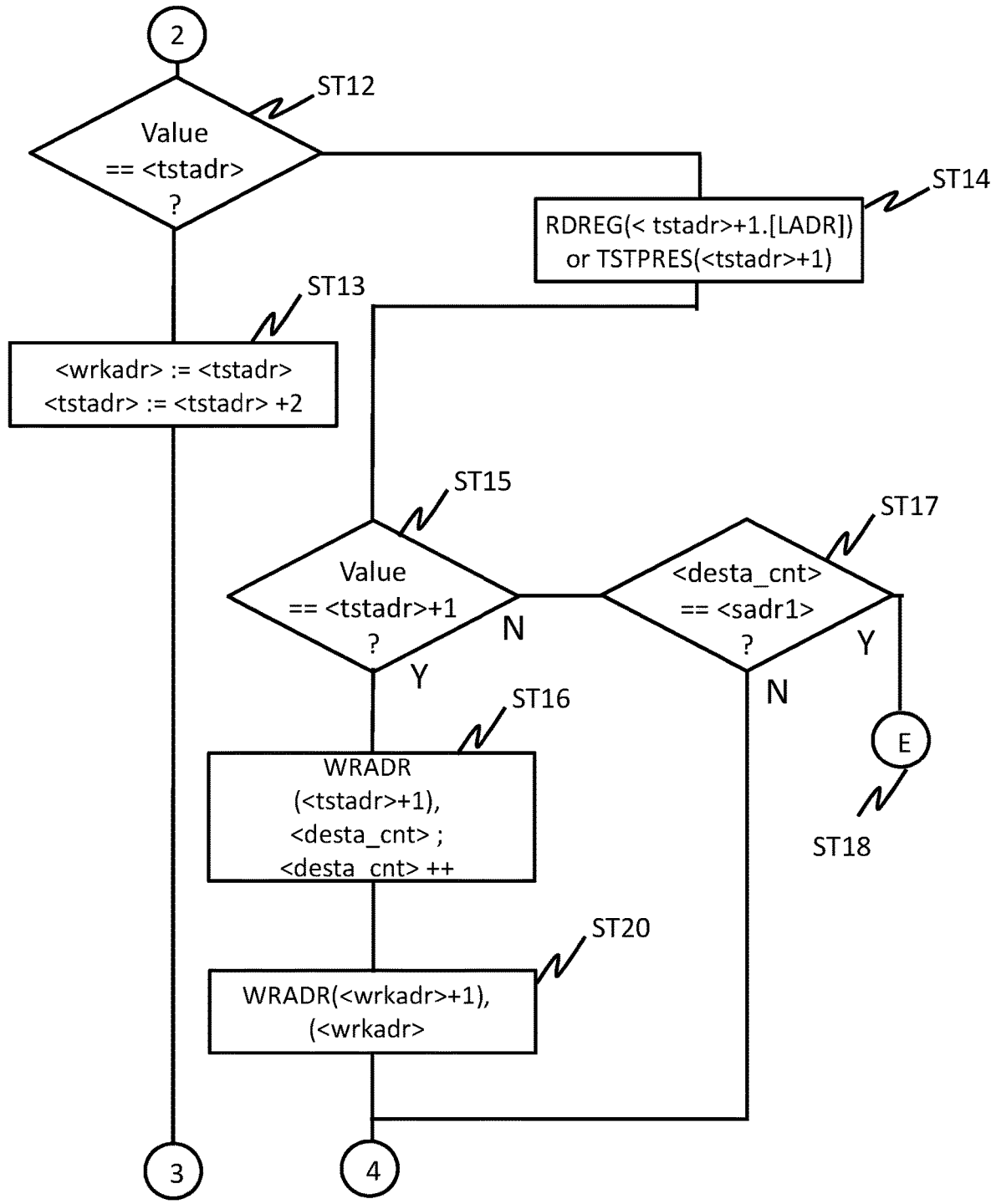
Figure 9D:
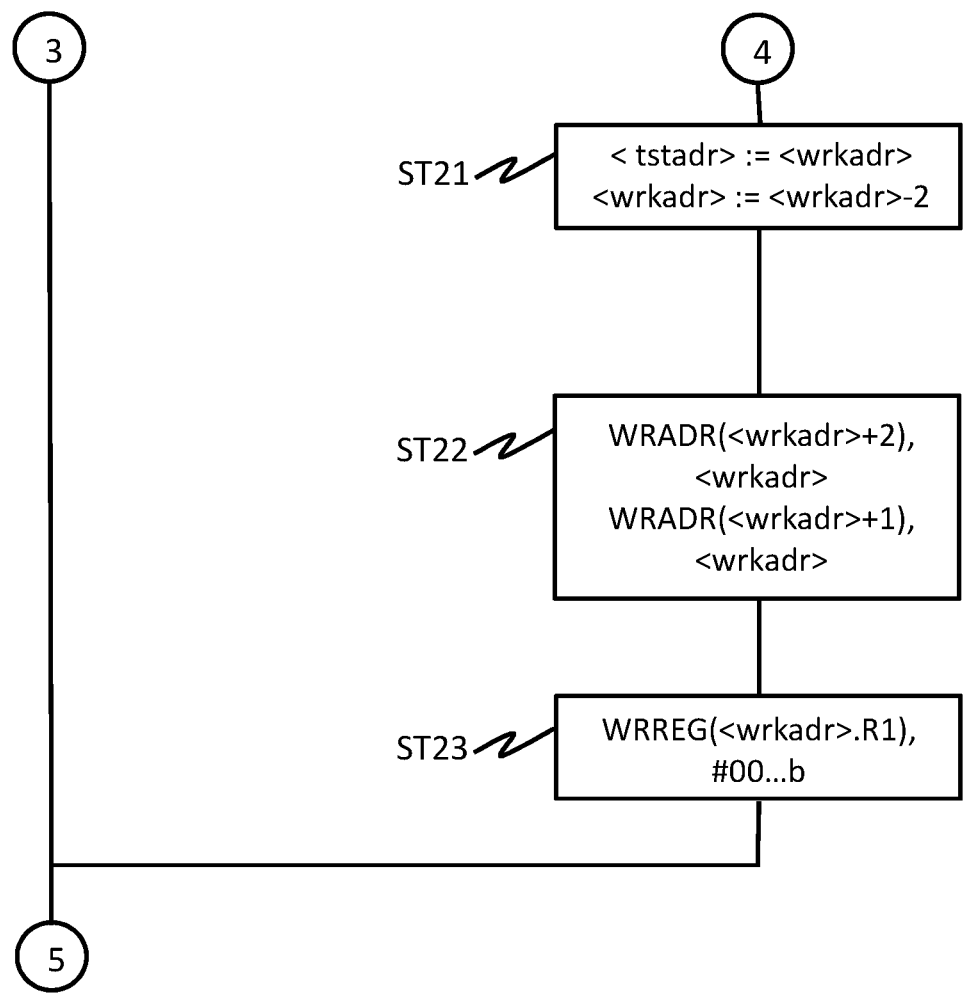
Figure 9E:
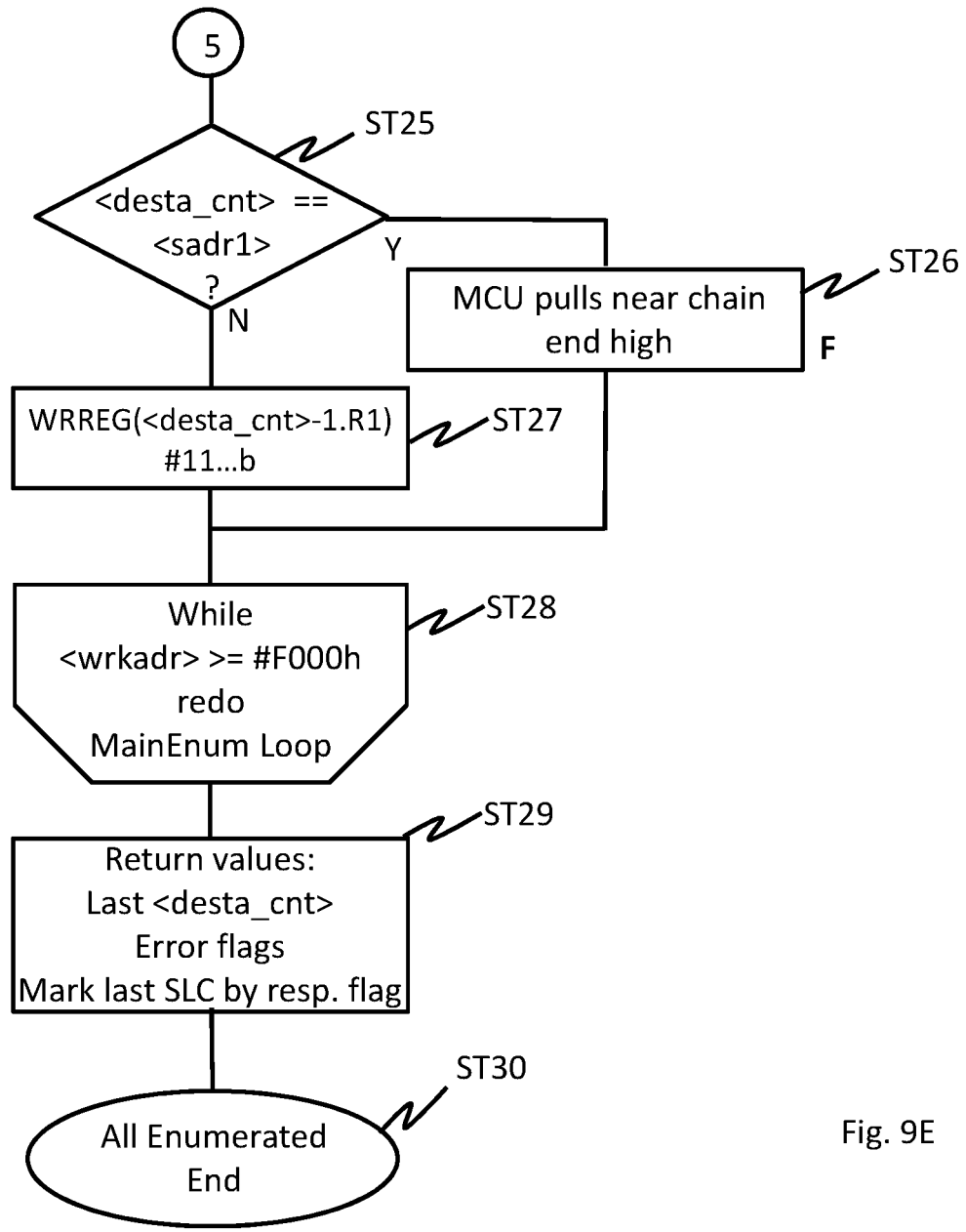

FIG. 8 illustrates further steps of the example for address allocation. The first line of addresses is copied from the last line of addresses in FIG. 7. Next step S27 sets the DET pins of all SLCs within the current united segment (addresses are #F000h) to input. Because the potential on the DET pins of following partitions is still 3.4 Volt, the 3.4 Volt is now nearer to the SLCs in the united segment than in step S5. This is the reason why it is easier to detect potential values at the SLCs within the united segment SE1, SE2, i.e. 0.4 Volt n SLC1, 0.8 Volt at SLC2 and so on to 3.2 Volt at SLC8. The reason is that the voltage divider for a voltage of 3.4 Volt is now formed of only eight resistors R1 to R8 instead of all sixteen resistors R1 to Rn as in steps S4 and S5.

It is assumed that the reasons for the two errors mentioned above are still there. Therefore, the potential on SLC5 is still 0.2 Volts lower than expected without error, i.e. 1.8 Volt instead of 2.0 Volt. The same is true for SLC7 having now a potential on its DET pin of 2.6 Volt instead of the expected 2.8 Volt. Again, it is stressed out that this is a simplification in order to show how the method works in principle.

Step S28 samples the potentials on the DET pins for all SLCs having source address #F000h. It is assumed again that 0.2 Volt "translate" into an address step of two. However, this is accidentally. For other examples the "translation ratio" may have other values that are higher or smaller. Masking for the highest four most significant bits is used again. There are the following addresses now: SLC1 #E0004h, SLC2 #E0008h, SLC3 #E000Ch, SLC4 #E0010h, SLC5 #E012h, SLC6 #E0018h, SLC7 #E001Ah, SLC8 #E0020h, i.e. they are in increasing order although the reason for the errors and the two errors are still there. However the sequence does not increase by the same value for all SLCs but this will be corrected within the next steps that allocate the final addresses in increasing order.

According to step S24 the working address wrkadr is still at #0000h, i.e. the first final address for the SLCs, i.e. especially for SLC1.

Step S32 sets the test address tstadr to #E000h. If no SLC responds in step S35 the test address is nevertheless incremented in step S39 to #E0001h, to #E002h, to #E003h and then to #E004h. Within the next loop of steps S33 to S40 step S36 allocates the first working address #0000h to the SLC with first address that is found in seed address space, i.e. to the SLC1 that got #E000h but gets #0000h in step S36. This is meant by relocation within address space. SLC2 gets final address #0001h and SLC3 gets final address #0002h. SLC4 gets final address #0003h. The allocation stops if all SLCs with addresses in the lower half of the united segments SE1 and SE2 have their final addresses.

Step S37 sets the DET pins of the SLC that have already a final address to low or 0 Volt in the example. Thus the segments that have already the final addresses do not influence the voltage divider of chain 4 of resistors R0 to Rn any more. At the moment 0 Volt is set to SLC1 to SLC4. The voltages on the DET pins of SLC5 to SLC8 changes accordingly, for instance to 0.7 Volt, 1.4 Volt, 2.1 Volt and 2.8 Volt.

Steps S41 to S43 collect the SLCs having addresses within the upper half of the address space of the united segments SE1, SE2 and transfer these addresses back to the source address, i.e. to #F000h.

The same steps are repeated for the next two segments, i.e. SE2 and SE3, within the following loop of steps S25 to S44. It is already visible from the voltages that are shown in FIG. 8 between the lines that start with S27 and S28 that the errors cannot influence the right allocation any more. This is also visible from the addresses shown in the line that starts with S28. However, within the second loop of steps S25 to S44 the voltage divider is only active in segments SE2 and SE3. Therefore, there will be other voltages on SLC5 to SLC12. Nevertheless the correction will work in the same way.

Thus SLC4 will get the final address #0003h and SLC5 will get the right address in step S36, i.e. #0004h. SLC6 gets #0005h and SLC7 gets #0006h, i.e. also the right address. SLC8 gets the final address #0007h. This means that the two errors did not have an influence on the final address allocation. Or in other words, the two errors were corrected. Then the addresses of SLCs in address segment SE3 are set back to source address #F000h, not shown in FIG. 8, and the steps are repeated again, uniting segments SE3 and SE4. Finally all SLCs will have their final addresses.

Uniting address partitions SE1, SE2 etc. using only the lower half of the seed addresses for final address allocation insures that detection errors at the end of the united segment do not have any significant influence. Furthermore, using only two segments is also useful for error compensation as the active part of the voltage divider of chain 4 is made smaller. The errors may result in an out of order sequence or in SLCs having the same addresses.

Procedure PrB uses the same principles as procedure PrC in order to make an intermediate refinement, i.e. up to 256 partitions. At the end of procedure PrB the method goes to procedure PrC using for instance source address #F200h instead of source address #F000h. This is because step S10 of procedure PrB sets the working address to #F200h too.

Process Flow if Schmitt Trigger Circuits (ST Circuits) are Used on DET Pins of SLCc In electronics, a Schmitt trigger is a comparator circuit with hysteresis implemented for instance by applying positive feedback to the non-inverting input of a comparator or differential amplifier. It is an active circuit which converts an analog input signal to a digital output signal. The circuit is named a "trigger" because the output retains its value until the input changes sufficiently to trigger a change. In the non-inverting configuration, when the input is higher than a chosen threshold, the output is high. When the input is below another (lower) chosen threshold which is different from the first threshold the output is low, and when the input is between the two levels the output retains its value. This dual threshold is the hysteresis.

Using the process flow shown in FIG. 9A to FIG. 9E the allocation goes on as shown in the following table. Z means a high ohmic output state on the DET pins of DET control units 404 of SLCs and subordinated MICs if any. The ST circuits may be centered to half Vdd and may have a range of for instance 0.8 Volt if Vdd is 3.3 Volt for instance. The letters A to F that are shown in FIGS. 9A to 9E are also used in the following table in order to ease the orientation, i.e. the mapping between both kinds of descriptions for the same allocation method. The table has a left part, a middle part and a right part which have to be put together using the same line numeration.

There is a command TSTPRES (<tstadr>) that was not mentioned above but which has the same function as the command RDREG (<tstadr>.[LBAR]) that was mentioned above. Basically it replaces the RDREG(<tstadr>.[LADR]) and the subsequent decision must be replaced by a decision like "SLC found ?". The decisions to be replaced are at the end of FIG. 5B (step ST11) and at the upper right of FIG. 5C (step ST14). Step ST14 has to be replaced by TSTPRES (<tstadr>+1). The directly following decision has to be rewritten as "SLC found?", i.e. step ST12 and step ST15.

Register R1 refers to the DET control unit 409a. The left bit stands for the pin value. A write to the DET pin sets the DET pin to the pin value of the left bit. A read to the DET pin reads the external to the left bit. The second bit from the left is 1 for output mode and 0 for input mode. If input mode is active, i.e. the second bit is 0 this means that the DET pin is high ohmic connected to chain 4, i.e. state "Z". If the DET pin is in output mode, i.e. the second bit is 1 the DET pin is driven with the value set by the first bit.

00: DET pin is in input mode, for instance step S13, S27, ST23, high ohmic, result of input follows value applied to DET pin externally, The output bit value (first bit) is ignored in input mode. A read always directly will read the external value.

10: DET pins to input, result of input follows value applied to DET pin externally (same as "00"), 01: output zero, for instance step S37, S12b, ST8, 11: output one, for instance step S23l, ST10, ST27.

The addresses of all SLCs are not shown in every line of the table. In order to ease understanding the addresses are mainly shown if there is a change in addresses. This is the left part of the table:

| | Command (Symbolic) | Mark | Command/State | Det In | Det Out |
|---|---|---|---|---|---|
| 1 | | | | | |
| 2 | | | Reset & Ends High | 111111 | ZZZZZZ |
| 3 | | | | | |
| 4 | | A | Near End := Low | 001011 | |
| 5 | WRADR_E (<wrkadr>), <tstadr> | | WRADR_E (#FFFFh), #F000h | | |
| 6 | WRREG (<tstadr>+1.R1), #11 . . . b | | WRREG (#F001h.Ra), #11 . . . b | 011111 | ZZ1Z11 |
| 7 | TSTPRES (<tstadr>) | B | TSTPRES (#F000h) | | |
| 8 | | F | Near End := High | 111111 | ZZ1Z11 |
| 9 | | | | | |
| 10 | | A | Near End := Low | 011111 | ZZ1Z11 |
| 11 | WRADR_E (<wrkadr>), <tstadr> | | WRADR_E (#F000h), #F002h | | |
| 12 | WRREG (<tstadr>+1.R1), #11 . . . b | | WRREG (#F003h.R1), #11 . . . b | 011111 | Z11Z11 |
| 13 | TSTPRES (<tstadr>) | B | TSTPRES (#F002h) | | |
| 14 | | F | Near End := High | 111111 | Z11Z11 |
| 15 | | | | | |

-continued

| | | | | | |
|---|---|---|---|---|---|
| 16 | | A | Near End := Low | 111111 | Z11Z11 |
| 17 | WRADR_E (<wrkadr>), <tstadr> | | WRADR_E (#F002h), #F004h | | |
| 18 | WRREG (<tstadr>+1.R1), #11 … b | | WRREG (#F005h.R1), #11 … b | 111111 | 111Z11 |
| 19 | TSTPRES (<tstadr>) | B | TSTPRES (#F004h) | | |
| 20 | TSTPRES (<tstadr>+1) | C | TSTPRES (#F005h) | | |
| 21 | WRADR(<tstadr>+1), <desta_cnt> | | WRADR(#F005h), #0000h | | |
| 22 | WRADR(<wrkadr>+1), <wrkadr> | | WRADR(#F003h), #F002h | | |
| 23 | | | (Rollback shelved) | | |
| 24 | WRADR(<wrkadr>+2), <wrkadr> | | WRADR(#F002h), #F000h | | |
| 25 | WRADR(<wrkadr>+1), <wrkadr> | | WRADR(#F001h), #F000h | | |
| 26 | WRREG (<wrkadr>.R1), #00 … b | | WRREG (#F000h.R1), #00 … b | 111111 | 1ZZZZZ |
| 27 | | F | Near End := High (1st SLC) | 111111 | 1ZZZZZ |
| 28 | | | | | |
| 29 | | A | Near End := Low (1st SLC) | 000111 | 0ZZZZZ |
| 30 | WRADR_E (<wrkadr>), <tstadr> | | WRADR_E (#F000h), #F002h | | |
| 31 | WRREG (<tstadr>+1.R1), #11 … b | | WRREG (#F003h.R1), #11 … b | 001111 | 0ZZ111 |
| 32 | TSTPRES (<tstadr>) | B | TSTPRES (#F002h) | | |
| 33 | | F | Near End := High (1st SLC) | 111111 | 0ZZ111 |
| 34 | | | | | |
| 35 | | A | Near End := Low (1st SLC) | 001111 | 0ZZ111 |
| 36 | WRADR_E (<wrkadr>), <tstadr> | | WRADR_E (#F002h), #F004h | | |
| 37 | WRREG (<tstadr>+1.R1), #11 … b | | WRREG (#F005h.R1), #11 … b | 001111 | 0Z1111 |
| 38 | TSTPRES (<tstadr>) | B | TSTPRES (#F004h) | | |
| 39 | | F | Near End := High (1st SLC) | 111111 | 1Z1111 |
| 40 | | | | | |
| 41 | | A | Near End := Low (1st SLC) | 011111 | 0Z1111 |
| 42 | WRADR_E (<wrkadr>), <tstadr> | | WRADR_E (#F004h), #F006h | | |
| 43 | WRREG (<tstadr>+1.R1), #11 … b | | WRREG (#F007h.R1), #11 … b | 001111 | 011111 |
| 44 | TSTPRES (<tstadr>) | B | TSTPRES (#F004h) | | |
| 45 | TSTPRES (<tstadr>+1) | C | TSTPRES (#F005h) | | |
| 46 | WRADR(<tstadr>+1), <desta_cnt> | | WRADR(#F007h), #0001h | | |
| 47 | WRADR(<wrkadr>+1), <wrkadr> | | WRADR(#F005h), #F004h | | |
| 48 | | | (Rollback to shelved) | | |
| 49 | WRADR(<wrkadr>+2), <wrkadr> | | WRADR(#F004h), #F002h | | |
| 50 | WRADR(<wrkadr>+1), <wrkadr> | | WRADR(#F003h), #F002h | | |
| 51 | WRREG (<wrkadr>.R1), #00 … b | | WRREG (#F002h.R1), #00 … b | 000111 | 01ZZZZ |
| 52 | | F | Near End := High (2nd SLC) | 011111 | 01ZZZZ |
| 53 | | | | | |

This is the middle part of the table:

| | Adr (SLC1) | Adr (SLC2) | Adr (SLC3) | Adr (SLC4) | Adr (SLC5) | Adr (SLC6) |
|---|---|---|---|---|---|---|
| 1 | | | | | | |
| 2 | #FFFFh | #FFFFh | #FFFFh | #FFFFh | #FFFFh | #FFFFh |
| 3 | | | | | | |
| 4 | #FFFFh | #FFFFh | #FFFFh | #FFFFh | #FFFFh | #FFFFh |
| 5 | #F000h | #F000h | #F001h | #F000h | #F001h | #F001h |
| 6 | #F000h | #F000h | #F001h | #F000h | #F001h | #F001h |
| 7 | | | | | | |
| 8 | | | | | | |
| 9 | | | | | | |
| 10 | | | | | | |
| 11 | #F002h | #F003h | #F001h | #F003h | #F001h | #F001h |
| 12 | | | | | | |
| 13 | | | | | | |
| 14 | | | | | | |
| 15 | | | | | | |
| 16 | | | | | | |
| 17 | #F005h | #F003h | #F001h | #F003h | #F001h | #F001h |
| 18 | | | | | | |
| 19 | | | | | | |
| 20 | | | | | | |
| 21 | #0000h | #F003h | #F001h | #F003h | #F001h | #F001h |
| 22 | #0000h | #F002h | #F001h | #F002h | #F001h | #F001h |
| 23 | | | | | | |
| 24 | #0000h | #F000h | #F001h | #F000h | #F001h | #F001h |
| 25 | #0000h | #F000h | #F000h | #F000h | #F000h | #F000h |
| 26 | | | | | | |
| 27 | | | | | | |
| 28 | | | | | | |
| 29 | | | | | | |
| 30 | #0000h | #F002h | #F002h | #F003h | #F003h | #F003h |
| 31 | | | | | | |
| 32 | | | | | | |
| 33 | | | | | | |
| 34 | | | | | | |
| 35 | | | | | | |
| 36 | #0000h | #F004h | #F005h | #F003h | #F003h | #F003h |
| 37 | | | | | | |
| 38 | | | | | | |
| 39 | | | | | | |
| 40 | | | | | | |
| 41 | | | | | | |
| 42 | #0000h | #F007h | #F005h | #F003h | #F003h | #F003h |
| 43 | | | | | | |
| 44 | | | | | | |
| 45 | | | | | | |
| 46 | #0000h | #0001h | #F005h | #F003h | #F003h | #F003h |
| 47 | #0000h | #0001h | #F004h | #F003h | #F003h | #F003h |
| 48 | | | | | | |
| 49 | #0000h | #0001h | #F002h | #F003h | #F003h | #F003h |
| 50 | #0000h | #0001h | #F002h | #F002h | #F002h | #F002h |
| 51 | | | | | | |
| 52 | | | | | | |
| 53 | | | | | | |

And this is the right part of the table:

| | Comment | wrkadr | tstadr | desta_cnt |
|---|---|---|---|---|
| 1 | | #FFFFh | #F000h | #0000h |
| 2 | | | | |
| 3 | | | | |
| 4 | | | | |

-continued

| | | | |
|---|---|---|---|
| 5 | | | |
| 6 | | | |
| 7 | Some SLC with Adr.LSB := 0 ? → Here: Yes | #F000h | #F002h |
| 8 | | | |
| 9 | | | |
| 10 | | | |
| 11 | | | |
| 12 | ST of SLC1 still low ! | | |
| 13 | Some SLC with Adr.LSB := 0 ? → Here: Yes | #F002h | #F004h |
| 14 | | | |
| 15 | | | |
| 16 | With only one SLC in low end portion the Schmitt-T stays high | | |
| 17 | | | |
| 18 | | | |
| 19 | Some SLC with Adr.LSB := 0 ? → Here: No | | |
| 20 | Some SLC with Adr.LSB := 1 ? → Here: Yes | | |
| 21 | | | #0001h |
| 22 | | | |
| 23 | Rollback to shelved SLCs. Stop and assess, if wrkadr becomes <#F000h | #F000h | #F002h |
| 24 | | | |
| 25 | | | |
| 26 | | | |
| 27 | | | |
| 28 | | | |
| 29 | | | |
| 30 | | | |
| 31 | | | |
| 32 | Some SLC with Adr.LSB := 0 ? → Here: Yes | #F002h | #F004h |
| 33 | | | |
| 34 | | | |
| 35 | | | |
| 36 | | | |
| 37 | | | |
| 38 | Some SLC with Adr.LSB := 0 ? → Here: Yes | #F004h | #F006h |
| 39 | | | |
| 40 | | | |
| 41 | | | |
| 42 | | | |
| 43 | | | |
| 44 | Some SLC with Adr.LSB := 0 ? → Here: No | | |
| 45 | Some SLC with Adr.LSB := 1 ? → Here: Yes | | |
| 46 | | | #0002h |
| 47 | | | |
| 48 | Rollback to shelved SLCs. Stop and assess, if wrkadr becomes <#F000h | #F002h | #F004h |
| 49 | | | |
| 50 | | | |
| 51 | | | |
| 52 | | | |
| 53 | | | |

The steps are repeated until all SLCs have their final address, i.e. in the example also SLC3 to SLC6. At the end of the procedures some steps may be performed to clear some variables etc.

FIGS. 9A to 9E illustrate a process flow for address allocation using ST circuits within bus units (SLC):

step ST1: For instance: Begin enumeration by host, i.e. by MCU or MIC.

step ST2: All SLCs release values on DET pin and reset their address for instance to #FFFFh (hexadecimal) For instance: This is done by the RESET command mentioned above or by power on.

step ST3: The MCU or the MIC pulls both chain 4 ends high. All SLCs will sample high on their DET pin.

step ST4: Preparations for the next loop are made. For instance: <wrkadr>:=#FFFFh, <tstadr>:=#F000h; <desta_cnt:>:=<sadr1>, i.e. the working address is set to #FFFFh, the test address is set to #F000h and the current value for the final address is set to the value given in sadr1, i.e. start address. In the example shown in the table, right part, right column, sadr1 and therefore also desta_cnt are #0000h but may have other values too.

step ST5: The main loop begins here and comprises steps ST5 to ST28. For instance: Begin: MainEnumLoop Do. This is mark A mentioned in the table above.

FIG. 9B:

step ST6: Checks if method is before allocating final address to first SLC. For instance: <desta_cnt>==<sadr1>? If yes, i.e. no final address has been allocated yet, step ST7 follows. If not, step ST8 follows.

step ST7: MCU or MIC pulls near chain 4 end to low because no final address has been allocated to an SLC yet. This pull down and the foregoing pull up are relevant for reproducible bistable characteristics of the ST circuits.

step ST8: The SLC that has received its final address in step ST16 during the preceding loop pulls near chain 4 end to low. For instance: WRREG (<desta_cnt −1>.R1)

01 ... b. This pull down and the foregoing pull up are relevant for reproducible bistable characteristics of the ST circuits.

step ST9: Write address register with test address considering output of ST circuit in least significant bit (LSB). SLCs executing an EnumWrite replace LSB of written data by the logical value sampled from DET pin. SLCs with DET==0 will relocate their address to the value of test address, i.e. <tstadr>. SLCs with DET==1 will relocate their address to the value of test address plus 1, i.e. <tstadr>+1. For instance: WRADR_E (<wrkadr>), <tstadr> step ST10: All SLCs at test address plus 1 will pull DET pin to high. For instance: WRREG (<tstadr>+1.R1) #11 ... b, i.e. set DET pin of addressed SLCs to 1.

step ST11: Read value from SLCs [LBAR] at <tstadr>. Remark: A specifically prepared test register in the SLC could be used as well. This is done in the table, i.e. TSTPRES(<tstadr>). For instance: RDREG(<tstadr>.[LBAR]) or TSTPRES(<tstadr>). This is mark B mentioned in the table above.

FIG. 9C:

step ST12: Tests if an SLC is at <tstadr>. For instance: Value==<tstadr>?, i.e. is there corresponding signaling on bus DHIB. If yes, step ST13 follows. If no, step ST14 follows. Other ways of testing are possible as well. The answer to TSTPRES(<tstadr>) may depend on initial setup: it may be answered by a PRESENT token sent back or by an OOB (Out Of Band) signaling. OOB is more robust if several SLCs are answering. So with TSTPRES used the question within the method flow may have to be replaced by "PRESENT or OOB signal received ?". With TSTPRES available the RDREG methods may be considered obsolete.

step ST13: Continues with separation of the next SLC for allocation of an address. For instance: <wrkadr>:=<tstadr>; <tstadr>:=<tstadr>+2 step ST14: Read value from SLCs [LBAR] at <tstadr>+1. Remark: A specifically prepared test register in the SLC could be used as well or a specific reaction could be triggered. The latter is done in the table, i.e. TSTPRES (<tstadr>+1). For instance: RDREG(<tstadr>+1.[LBAR]) or TSTPRES(<tstadr>+1). TSTPRES may not use a special register but may just trigger a specific reaction of the addressed SLCs' command engines, which may be technically a superior method compared to the original register usage. The question is not shown in the table, since the answer manifests itself by the reaction (:=SLC there) or no reaction (:=no SLC there).

step ST15: Tests if an SLC is at <tstadr>+1. For instance: Value==<tstadr>+1 ?, i.e. is there corresponding signaling on bus DHIB. If yes, step ST16 follows. If not, step ST17 follows. This is mark C mentioned in the table above. Again, alternative methods for answering TSTPRES may be used.

step ST16: Moves separated SLC from (<tstadr>+1) to unique <desta_cnt>. For instance: WRADR(<tstadr>+1), <desta_cnt>; <desta_cnt>++. Next step is step ST20.

step ST17: Checks if method takes place before allocating final address to first SLC. For instance: <desta_cnt>==<sadr1>? If yes, i.e. no final address has been allocated yet, step ST18 follows. If not, step ST21 follows. This is mark D mentioned in the table above. Step ST17 is relevant at the end of the method, i.e. if all SLCs already have their final address. Step ST17 performs an error check.

step ST18: No SLC there. For instance: Error Exit.

step ST20: Preceding step is step ST16. Collects the SLCs shelved to <wrkadr+1> by the preceding iteration. For instance: WRADR(<wrkadr>+1), <wrkadr>

FIG. 9D:

step ST21: Roll back one stage. For instance: <tstadr>:=<wrkadr> and <wrkadr>:=<wrkadr>−2 step ST22: Collects to wrkadr. For instance: WRADR (<wrkadr>+2), <wrkadr> and WRADR(<wrkadr>+1), <wrkadr> step ST23: Switches the collected SLCs DET drivers off. For instance: WRREG (<wrkadr>.R1), #00 ... b. First binary value 0 stands for output value but has no relevance here because the second binary value 0 stands for output function inactive.

FIG. 9E:

step ST25: Checks if method takes place before allocating final address to first SLC. For instance: <desta_cnt>==<sadr1>?

If yes, i.e. no final address has been allocated yet, step ST26 follows. If not, step ST27 follows.

step ST26: MCU or MIC pulls near chain end high because no final address has been allocated to an SLC yet. This pull up and the following pull down in step ST7 or ST8 are relevant for reproducible bistable characteristics of the ST circuits.

step ST27: The SLC that has received its final address in step ST16 during the preceding loop pulls near chain (4) end to high. For instance: WRREG (<desta_cnt −1>.R1) #11 ... b. This pull up and the following pull down in step ST7 or ST8 are relevant for reproducible bistable characteristics of the ST circuits.

step ST28: For instance: While <wrkadr>>=#F000h redo MainEnum Loop

This is mark F mentioned in the table above. If the condition is fulfilled the next loop of steps ST5 to ST28 is performed. If not, step ST29 follows. The working address wrkadr is reduced in step ST21. If all SLCs have their final address wrkadr will get smaller than #F000h.

step ST29: This step returns the relevant values and sets some flags. For instance: Return values: Last <desta_cnt> value, i.e. last final address that has been allocated. This allows for instance to determine the number of SLCs. Error flags may be set if applicable and the last SLC may be marked by setting a respective flag in this SLC.

step ST30: The end of the allocation procedure. For instance: All Enumerated END.

Now it is described what is done according to each line of the above table. i.e.:

Line 1: this line gives headlines for the columns of the table, i.e.:

column 1 shows the line numbers, column 2 states the command that is used in its general form, column 3 shows a mark that is also used in FIGS. 9A to 9E, column 4 shows the detailed form of the current command, column 5 (DET in) gives the logical values at the output of the ST circuits of all six SLCs of the example, for instance 001011 would stand for 0 SLC1, 0 for SLC2, 1 for SLC3 and so on, see table, column 5, line 4. This is the effect of the voltage divider that is formed by the resistors of chain 4 considering 0 Volt on one end and High voltage potential at the other end. There is also an error on the border between the two groups, i.e. a group that detects logical 1 and the group that detects logical1. However this error is compensated by the method.

column 6 (DET out) shows the state of the output on DET pins of the SLC. "Z" means high ohmic state, i.e. inactive. 0 refers to low potential and 1 to high potential. The order of the values corresponds again to the order of the SLCs on bus DHIB. ZZ1Z11 stands for Z on SLC1, Z on SLC2, 1 on SLC3 and so on.

column 7 shows the current address in address register LBAR1 of SLC1, column 8 shows the current address in address register LBAR2 of SLC2, column 9 shows the current address in address register LBAR3 of SLC3, column 10 shows the current address in address register LBAR4 of SLC4, column 11 shows the current address in address register LBAR5 of SLC5, column 12 shows the current address in address register LBAR6 of SLC6, column 13 shows comments if appropriate, column 14 refers to the current value of the working address wrkadr, column 15 refers to the current value of test address tstadr, and column 15 refers to current values of the variable desta_cnt, i.e. the final address that has to be used next for allocation of addresses.

Line 2: Steps ST1 to ST4 are performed. After RESET Det In would be 111111 because both ends of chain 4 are high. Det Out is ZZZZZZ, i.e. no outputs are set on chain 4 by SLCs. All addresses are for instance #FFFFh. The wrkadr is #FFFFh. The tstadr is #F000h and the value of desta_cnt is #0000h, i.e. the first final address for allocation.

Line 3 is empty. Line 4: Steps ST5, ST6 and ST7 are performed because the condition in step ST6 is fulfilled, i.e. yes branch. Near end of chain 4 is pulled low by MCU. This results in possible Det In of 001011. Other cases may not include errors and look like 000111. The addresses of the SLCs are unchanged. The table shows mostly changes. Unchanged addresses of the SLCs are not repeated in the following lines.

Line 5: Step ST9 is performed. SLCs having address #FFFFh with 0 on DET pin get the address #F000h, i.e. SLC1, SLC2 and SLC4. SLCs having address #FFFFh with 1 on DET pin get address #F001h, i.e. the last bit depends on the input value on DET pin. SLC3, SLC5 and SLC6 have now preliminary address #F001h. This is more visible if the last parts of the addresses are written in binary numbers instead of hexadecimal numbers, i.e. SLC1 has preliminary address # . . . 00b and SLC3 has # . . . 01b.

Line 6: Step ST10 is performed, i.e. all SLCs that have address #F001h, i.e. output value of ST circuit was 1, i.e. input of ST circuit was above threshold value, put their DET pins to high. Det Out is therefore ZZ1Z11 for SLC1 to SLC6. This effects back to possible Det In because the potentials on the taps of the voltage divider are changed. It is not possible to have voltage zero between taps that have high potential or logical 1. This changes the possible Det In for SLC4 from 0 to 1. Furthermore, there is a kind of bisectional method because the voltage divider of chain 4 is now active only for the first part of the chain, i.e. SLC1 and SLC2. It is assumed that the threshold value of the ST circuit of SLC1 is not reached on DET pin of SLC1, i.e. Det In has a 0. It is further assumed that the threshold value of the ST circuit of SLC2 is reached, i.e. Det In has a 1 for SLC2. This results in Det In of 011111 for SLC1 to SLC6. However, the ST circuits have a hysteresis that has to be considered. This time the case is clear for SLC2 because the potential on its DET pin is ⅔ of Vdd, i.e. its ST circuit gives logical 1 on its output.

Line 7: Step ST11 is performed. It is tried to read at least one SLC with address of tstadr, i.e. #F000h, i.e. lower half of SLCs. Step ST12 gives yes because SLC1, SLC2 and SLC4 will answer to TSTPRES that is an access on bus DHIB that depending on configuration bit setting may trigger either a PRESENT token being sent back (like an ACK) or an OOB signaling being invoked by the SLC situated at the accessed address. The read value may alternatively be the address that is equal for these SLC, i.e. no data mismatch will be there. Step ST13 follows, i.e. wrkadr gets the value of tstadr and tstadr is incremented by value 2, see columns 14 and 15.

Line 8: Step ST25 checks if the method is still in the beginning phase, i.e. no SLC has an allocated final address. This is true at the moment, i.e. condition in ST25 is yes and Step ST26 follows, i.e. MCU or MIC pulls near end of chain 4 to high potential. Step ST25 is performed in the MCU or in the MIC. Step ST26 results in Det In 111111. Det Out is unchanged. Step ST28 results in a further loop.

Line 9 is empty. Line 10: Next step is ST6 that checks if method is still at the beginning, i.e. no final address has been allocated yet. This is true, i.e. yes branch is performed and step ST7 follows. MCU pulls near end of chain 4 to low potential. Step ST7 is performed in SLCs as well as in MCU or MIC. Step ST7 results in Det In 001111. Det Out is unchanged.

Line 11: Step ST9 is performed. SLCs having address #F000h with 0 on DET pin get the current tstadr address #F002h, i.e. only SLC1. SLCs having address #F000h with 1 on DET pin get address #F003h, i.e. the last bit depends on the input value on DET pin. SLC2 and SLC4 have now preliminary address #F003h. This is more visible if the last parts of the addresses are written in binary numbers instead of hexadecimal numbers, i.e. SLC1 has preliminary address # . . . 10b and SLC2 and SLC4 have # . . . 11b.

Line 12: Step ST10 is performed, i.e. all SLCs that have address #F003h, i.e. output value of ST circuit was 1 within last performance of step ST9, i.e. input of ST circuit was above threshold value, put their DET pins to high. Det Out is therefore Z11Z11 for SLC1 to SLC6, i.e. there is a change for SLC2. At the moment, this has no effect on possible Det In because only one SLC, i.e. SLC1 is left in the active first part of chain 4 and is assumed that the voltage potential of ½ Vdd is on its DET pin. This does not result in a change of the output of the ST circuit yet because of the hysteresis effect of the ST circuit.

Line 13: Step ST11 is performed. It is tried to trigger response from at least one SLC with address of tstadr, i.e. #F002h, i.e. lower half of lower half of SLCs. Step ST12 gives yes because SLC1 will answer to TSTPRES that is a "response request" access on bus DHIB. Step ST13 follows, i.e. wrkadr gets the value of tstadr, i.e. it has now value #F002h and tstadr is incremented by value 2 to #F004h, see columns 14 and 15.

Line 14: Step ST25 checks if method 900 is still in the beginning phase, i.e. no SLC has an allocated final address. This is true at the moment, i.e. condition in ST25 is yes and Step ST26 follows, i.e. MCU or MIC pulls near end of chain 4 to high potential. Step ST26 results in Det In 111111. Det Out is unchanged. Step ST28 results in a further loop.

Line 15 is empty. Line 16: Next step is ST6 that checks if method 900 is still at the beginning, i.e. no final address has been allocated yet. This is true, i.e. yes branch is performed and step ST7 follows. MCU pulls near end of chain 4 to low potential. Step ST7 is performed in SLCs as well as in MCU or MIC. Step ST7 results in Det In 111111. Det Out is unchanged. This means that the ST circuit of SLC1 remains on logical 1 because ½ Vdd is not below its lower threshold value, see also comment in table, column 13.

Line 17: Step ST9 is performed. SLCs having address #F002h with 0 on DET pin get the current tstadr address #F004h, i.e. no SLC. SLCs having address #F002h with 1 on DET pin get address #F005h, i.e. the last bit depends on the input value on DET pin. SLC1 has now preliminary address #F005h.

Line 18: Step ST10 is performed, i.e. all SLCs that have address #F005h, i.e. output value of ST circuit was 1 within last performance of step ST9, i.e. input of ST circuit was above upper threshold value or at least not below lower threshold voltage of ST circuits, put their DET pins to high. Det Out is therefore 111Z11 for SLC1 to SLC6, i.e. there is a change for SLC1. At the moment, this has no effect on possible Det In.

Line 19: Step ST11 is performed. It is tried to get a response from at least one SLC with address of tstadr, i.e. #F004h, i.e. further lower parts of SLCs. Step ST12 gives no because no SLC will answer to TSTPRES that is a response request access on bus DHIB. Step ST14 of the no branch follows.

Line 20: Step ST14 is performed for the first time within the example. It is tried to get a response from at least one SLC with address of tstadr+1, i.e. #F005h, i.e. the remaining SLC with the highest preliminary address. Step ST15 gives yes because SLC1 will answer to TSTPRES. Step ST16 of the yes branch follows.

Line 21: Step ST16 is performed, i.e. the first final address is allocated. SLC1 gets final address #0000h (h stands for hexadecimal) or address 0. Furthermore, the value of desta_cnt is incremented by 1 to have the next final address for allocation, see column 16.

Line 22: Step ST20 is performed and collects the SLCs allocated to wrkadr+1 by the iteration done before, i.e. to #F003h. This is relevant for SLC2 and SLC4 in the example. The addresses of these SLCs, i.e. SLC2 and SLC4 are set back to wrkadr, i.e. to #F002, see columns 8 and 10.

Line 23: Step ST21 rolls back to shelved SLCs by assigning the working address wrkadr to tstadr that gets value #F002h, see column 15. Furthermore the value of wrkadr is reduced or decremented by 2, i.e. again to #F000h in the example. This may be the right time to check if wrkadr becomes <#F000h. If yes the method should leave the main loop and proceed with step ST29.

Line 24: Step ST22 is performed and collects all even preliminary addresses back to wrkadr, i.e. to #F000h in the example, see columns 8 and 10 for SLC2 and SLC4.

Line 25: Step ST22 is performed and collects all uneven preliminary addresses back to wrkadr, i.e. to #F000h in the example, see columns 9, 11 and 12 for SLC3, SLC5 and SLC6.

Line 26: Step ST23 is performed to switch off the DET drivers of the collected SLCs. This is done by activating input mode where the input lines are in a high ohmic state. Det Out in column 6 changes accordingly to 1ZZZZZ.

Line 27: Step ST25 is performed and the MCU or the MIC checks the condition. Step ST27 follows immediately after step ST25 this time, because desta_cnt is different from the start address, i.e. one final address allocation has been performed already. The MCU or the MIC sends the WRREG command on bus DHIB. SLC1 is addressed with address desta_cnt−1, i.e. with address #F000h. DET pin high on SLC1 results in Det In of 111111 for DET pins of SLC1 to SLC6, see column 5. However, at the moment DET In is unchanged with 111111. A change is for instance visible in line 52 where the second SLC2 pulls the near end to high potential.

Line 28 is empty. Line 29: Step ST6 is performed because next loop starts. The MCU decides in Step ST6 to go to Step ST8, i.e. no branch, because the condition that is tested is not fulfilled, i.e. at least one SLC has its final address already, namely SLC1, i.e. the first SLC on bus DHIB that is nearest to the start of chain 4. The MCU sends the WRREG command in step ST8 in order to pull near and of chain 4 to low, see column 6 with 0ZZZZZ. However the near end is now not the DET pin on MIC or MCU but the DET pin on SLC1, i.e. the near end has changed position and is now nearer to the far end of chain 4. The active part of chain, i.e. the voltage dividing part is made shorter in this way. A shorter voltage divider gives larger steps in voltage increase along the chain. This enables robustness against interference, tolerances of electronic parts, noise etc. The zero output voltage on DET pin of SLC1 also changes Det In constellation to 000111, see column 5 in current line, i.e. line 29. The remaining SLCs SLC2 to SLC6 are divided into two groups again, i.e. one group showing 0 on Det In and the other group showing 1 on Det In. The 0 corresponds to a potential that will result in 0 output of ST circuit. Correspondingly, the 1 corresponds to a potential that will result in 1 output of ST circuit Line 30: Step ST9 is performed, see for instance the description of line 5, 11 or 17 given above. All SLCs with address #F000h change their address depending on the DET In analog value to #F002h if potential on DET pin results in logical 0 on the output of the Schmitt trigger. This is the case for SLC2 and SLC3. If Det In is 1 the respective SLC changes its address to #F003h because of LSB (Least Significant Bit) with value 1 of output of the respective ST circuit (ST circuit).

Line 31: Step ST10 is performed, see for instance the description of line 6, 12 or 18. The DET pins of SLCs with uneven addresses are set to 1, i. e. Det Out 0ZZ111 in column 6. This has an effect to Det In, for instance 001111 results from new potentials within voltage divider chain 4.

Line 32: Step ST11 is performed, see for instance the description of line 7, 13 or 19. There are some SLCs with LSB 0. Therefore, some SLCs are detected in step ST12 and step ST13 follows. In step ST13, the working address gets the value of the test address, i.e. #F002h, see column 14, and the tstadr is incremented by 2 to #F004, see column 15.

Line 33: The condition that is tested in Step ST27 is not fulfilled, i.e. MCU or MIC commands SLC1 to pull near end to high, see 111111 for Det In.

Line 34 is empty. Line 35: Near end is pulled to low by SLC1. This time Det In pattern is not changed, because the analog voltages on DET pins are not within the two threshold values of the ST circuits. However, the first part of the remaining SLC is again partitioned, i.e. ST circuit of SLC2 detects logical 0 and ST circuit of SLC3 detects logical 1.

Line 36: Step ST9 is performed. Addresses are changed in SLCs having address #F002h to #F004h if DET pin input results in logical 0 on output of ST circuit. This is true for SLC2, see column 8. Addresses are changed in SLCs having address #F002h to #F005h if DET pin input results in logical 1 on output of ST circuit. This is true for SLC3, see column 9.

Line 37: Step ST10 is performed. SLCs at tstadr+1, i.e. at #F005h, have to set DET to output 1, see Det Out 0Z1111, i.e. there is a change for SLC3. This shortens the active part of the voltage divider (R0 to Rn) coming from the far end of chain 4.

Line 38: Step ST11 is performed, i.e. a response request access to SLCs having tstadr, i.e. #F004h. SLC2 will answer at step ST12. In step ST13, the working address gets the value of the test address, i.e. #F004h, see column 14, and the tstadr is incremented by 2 to #F006, see column 15.

Line 39: Step ST25 results in step ST27, i.e. SLC1 pulls near end of shortened active chain 4 to high, see Det Out 1Z1111 and Det In 111111 in column 5. Next main loop is started.

Line 40 is empty. Line 41: Step ST8 is performed and SLC1 pulls near end of shortened active chain 4 to low, i.e. Det Out is changed to 0Z1111. Thus, Det In is changed on SLC2 to 1, i.e. the output of ST circuit of SLC2 stays at logical 1 because ½ Vdd is not enough to be smaller than the lower trigger threshold but the value 1 that was there before was over the upper trigger threshold.

Line 42: Step ST9 is performed, i.e. all SLCs with wrkadr #F004h are set to tstadr #F006h if LSB depending on output of ST circuit is 0. But this is not the case. SLCs with wrkadr #F004h are set to tstadr+1, i.e. to #F007h if LSB depending on output of ST circuit is 1. This is true for SLC2, see column 8.

Line 43: Step ST10 is performed, i.e. All SLCs at tstadr+1, i.e. at #F007h, will pull DET to high. This is the case for SLC2. Det Out changes to 011111, see column 6.

Lines 44 to 52 correspond in principle to lines 19 to 27 if the different addresses wrkadr and tstadr are considered.

The flow of FIGS. 9A to 9E is executed again and again in the same manner as described above. Further lines would follow in the table to show the allocation of further final addresses #0002h, #0003h, #0004h and #0005h to SLC3, SLC4, SLC5 and SLC6 respectively. Allocation of final address #0005h to last SLC6 would be mentioned in line 122 of the complete table. At the end of the method some optional tiny up work may be performed, for instance using step ST17 (mark D). The complete table would mention step ST17 in line 135 and in line 147. The last line 152 of the complete table deals with step ST28, i.e. mark F. The wrkadr is smaller than #F000h then. The main loop is left and step ST29 is performed. After step ST29, Step ST30 is performed as the last step of the method.

Although embodiments of the present invention and their advantages have been described in detail above, it should be understood that various changes, substitutions and alterations can be made therein without departing from the spirit and scope of the invention as defined by the appended claims. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within their scope such systems, processes, methods or steps.

It is possible to combine the embodiments of the introduction with each other. Furthermore, it is possible to combine the examples of the description of Figures with each other. Further, it is possible to combine the embodiments of the introduction and the examples of the description of Figures. It is further possible to change the order of steps in the methods described above to include more steps or to use fewer steps than shown in the Figures. Methods may be performed using only circuitry, i.e. no processor and software, or using software as well.

The invention claimed is:

1. A method for allocating addresses to electronic units, comprising:
providing a first electronic unit and a second electronic unit, each of which being electrically connected to different positions of a chain of electronic elements;
generating an electronic signal for detecting the first electronic unit and the second electronic unit on the chain of electronic elements;
comparing a first value of the electronic signal detected by the first electronic unit on a first position of the chain of electronic elements with at least one threshold value;
comparing a second value of the electronic signal detected by the second electronic unit on a second position of the chain of electronic elements with the at least one threshold value, wherein the second position of the chain of electronic elements is different from the first position;
generating a preliminary address of the first electronic unit depending on a result of the comparison based on the first value; and
generating a preliminary address of the second electronic unit depending on a result of the comparison based on the second value, the preliminary address of the first electronic unit and the preliminary address of the second electronic unit being used as seeds to generate final addresses for the first electronic unit and the second electronic unit.

2. The method according to claim 1, whereby at least 10 electronic units are connected to different positions of the chain, the electronic units comprise the first electronic unit and the second electronic unit, and
each of the electronic units have identical structure and identical functions.

3. The method according to claim 2, whereby the electronic units are configured to generate signals that are applied to the chain of electronic elements.

4. The method according to claim 2, whereby partitions for the electronic units are formed within a preliminary address range, and for each of the partitions only a part of the chain of electronic elements is used for the detection and other parts the chain of electronic elements are held to an identical electric potentials.

5. The method according to claim 4, whereby within at least one partition, sub partitions of the at least one partition are formed, and for each of the sub partitions, only a part of the chain of electronic elements is used for the detection and other parts of the chain of electronic elements are held to an identical electric potential.

6. The method according to claim 4, whereby during allocation of final addresses for the electronic units, at least two partitions are united within a preliminary address range, the detection is made again for electronic units that have addresses within the preliminary address range.

7. The method according to claim 2, whereby Schmitt trigger circuits are used within the electronic units, a Schmitt trigger circuit converts an analog input signal into a digital output signal depending on at least one threshold value.

8. The method according to claim 7, whereby a command is used for writing address registers in the electronic units with data addressing the electronic units respectively, at least one bit of the written data depends on an output value of the Schmitt trigger circuit within respective one of the electronic units.

9. The method according to claim 7, whereby at least one of following commands is used for allocating addresses to the electronic units,
- a1) a command for reading an address register in at least one of the electronic units that has an address given in the command,
- a2) a command for testing if at least one of the electronic units has an address that is given in the command, whereby an electronic unit that has this address answers with a special token on a bus with an out of band signaling, with the address or in another predefined way,
- b) a command that determines an output value that has to be applied to the chain of electronic elements by at least one of the electronic units that has an address that is given within the command, whereby one bit of binary value determines that an output mode or an input mode shall be active and whereby another bit of binary value determines a value of the output, or
- c) a command for writing an address register in electronic units that are addressed by the command,
whereby at least one bit of the written data depends on the output value of the Schmitt trigger circuit within the respective one of the electronic units.

10. The method according to claim 1, whereby the chain of electronic elements comprises two electronic elements, the electronic elements comprise at least one of resistors, capacitors, capacitors, or electronic active elements.

11. A control unit within an input arrangement, within a chain of optical output elements or within a display, comprising:
- an internal control unit configured to allocate addresses to electronic units by:
  - generating an electronic signal for detecting a first electronic unit and a second electronic unit on the chain of electronic elements, the first electronic unit and the second electronic unit being electrically connected to different positions of the chain of electronic elements;
  - comparing a first value of the electronic signal detected by the first electronic unit on a first position of the chain of electronic elements with at least one threshold value;
  - comparing a second value of the electronic signal detected by the second electronic unit on a second position of the chain of electronic elements with the at least one threshold value, wherein the second position of the chain of electronic elements is different from the first position;
  - generating a preliminary address of the first electronic unit depending on a result of the comparison based on the first value; and
  - generating a preliminary address of the second electronic unit depending on a result of the comparison based on the second value, the preliminary address of the first electronic unit and the preliminary address of the second electronic unit being used as seeds to generate final addresses for the first electronic unit and the second electronic unit.

12. The control unit according to claim 11, whereby the internal control unit is configured to allocate addresses to the first electronic unit and the second electronic unit using analog to digital converters or Schmitt trigger circuits within the first electronic unit and the second electronic unit.

* * * * *